US012744184B2

(12) United States Patent
Van Zyl et al.

(10) Patent No.: US 12,744,184 B2
(45) Date of Patent: Sep. 22, 2026

(54) INTEGRATED CONTROL OF A PLASMA PROCESSING SYSTEM

(71) Applicant: Advanced Energy Industries, Inc., Denver, CO (US)

(72) Inventors: Gideon Van Zyl, Fort Collins, CO (US); Thomas Joel Blackburn, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 52 days.

(21) Appl. No.: 19/055,883

(22) Filed: Feb. 18, 2025

(65) Prior Publication Data

US 2025/0323019 A1 Oct. 16, 2025

Related U.S. Application Data

(63) Continuation of application No. 17/181,382, filed on Feb. 22, 2021, now Pat. No. 12,230,476, which is a (Continued)

(51) Int. Cl.
*H01J 37/32* (2006.01)

(52) U.S. Cl.
CPC .. *H01J 37/32146* (2013.01); *H01J 37/32183* (2013.01); *H01J 37/32357* (2013.01); (Continued)

(58) Field of Classification Search
CPC ........... H01J 37/32146; H01J 37/32183; H01J 37/32357; H01J 37/32697; (Continued)

(56) References Cited

U.S. PATENT DOCUMENTS 4,796,650 A 1/1989 Nakamura et al.
4,898,798 A 2/1990 Sugata et al.
(Continued)

FOREIGN PATENT DOCUMENTS

JP H06-338476 A 6/1994
JP 2001525601 A 12/2001
(Continued)

OTHER PUBLICATIONS

Chai, Raymond Rei-Yang, Final Office Action issued in U.S. Appl. No. 17/678,604, Feb. 26, 2025, 19 pages.
(Continued)

*Primary Examiner* — Abdullah A Riyami
*Assistant Examiner* — Syed M Kaiser
(74) *Attorney, Agent, or Firm* — NOD Law PC

(57) ABSTRACT

Plasma processing systems and power delivery methods are disclosed. A system may comprise at least one modulating supply that modulates plasma properties where the modulation of the plasma properties has a repetition period, T. Electrical characteristics of an output of the modulating supply are monitored and provided to a controller where the electrical characteristics are analyzed. Characteristics of a waveform with the repetition period T are communicated to at least one piece of equipment connected to plasma processing system to enable synchronization of pieces of equipment connected to the plasma processing system. And in addition, instructions are relayed to the modulating supply and a match network, based on the analyzing of the electrical characteristics, enabling simultaneous tuning of the modulating supply and the match network.

18 Claims, 21 Drawing Sheets

Related U.S. Application Data continuation-in-part of application No. 17/031,027, filed on Sep. 24, 2020, now Pat. No. 11,264,209, which is a continuation of application No. 16/194,125, filed on Nov. 16, 2018, now Pat. No. 10,811,227.

(60) Provisional application No. 62/588,255, filed on Nov. 17, 2017.

(52) U.S. Cl.
CPC ... *H01J 37/32697* (2013.01); *H01J 2237/332* (2013.01); *H01J 2237/334* (2013.01)

(58) Field of Classification Search
CPC ........... H01J 2237/332; H01J 2237/334; H01J 37/32155; H01J 37/32174; H01J 37/32926; H01J 37/32935; H01J 37/3299
See application file for complete search history.

(56) References Cited

U.S. PATENT DOCUMENTS

| | | | |
|---|---|---|---|
| 5,242,561 | A | 9/1993 | Sato |
| 5,250,165 | A | 10/1993 | Berglund et al. |
| 5,531,862 | A | 7/1996 | Otsubo et al. |
| 5,573,597 | A | 11/1996 | Lantsman |
| 6,110,287 | A | 8/2000 | Arai et al. |
| 9,287,086 | B2 | 3/2016 | Brouk et al. |
| 9,287,092 | B2 | 3/2016 | Brouk et al. |
| 9,309,594 | B2 | 4/2016 | Hoffman et al. |
| 9,435,029 | B2 | 9/2016 | Brouk et al. |
| 9,685,297 | B2 | 6/2017 | Carter et al. |
| 11,011,349 | B2 | 5/2021 | Brouk et al. |
| 11,615,941 | B2 | 3/2023 | Brouk et al. |
| 11,978,611 | B2 | 5/2024 | Carter et al. |
| 12,154,759 | B2 | 11/2024 | Carter et al. |
| 12,230,476 | B2 | 2/2025 | Van Zyl et al. |
| 2005/0039682 | A1 | 2/2005 | Dhindsa et al. |
| 2005/0195223 | A1 | 9/2005 | Nitta et al. |
| 2007/0035908 | A1 | 2/2007 | Kitsuni et al. |
| 2007/0246163 | A1 | 10/2007 | Paterson et al. |
| 2009/0044750 | A1 | 2/2009 | Pipitone |
| 2009/0298287 | A1 | 12/2009 | Shannon et al. |
| 2010/0000970 | A1 | 1/2010 | Koshimizu et al. |
| 2010/0018648 | A1 | 1/2010 | Collins et al. |
| 2010/0072172 | A1 | 3/2010 | Ui et al. |
| 2010/0328439 | A1 | 12/2010 | Mihara et al. |
| 2011/0031217 | A1 | 2/2011 | Himori |
| 2011/0253672 | A1 | 10/2011 | Kamibayashi et al. |
| 2011/0309049 | A1 | 12/2011 | Papasouliotis et al. |
| 2012/0203134 | A1 * | 8/2012 | Kinrot .................. A61B 5/0265 600/547 |
| 2013/0220549 | A1 | 8/2013 | Wilson |
| 2014/0111981 | A1 | 4/2014 | Watanabe |
| 2017/0040176 | A1 | 2/2017 | Long et al. |
| 2017/0103873 | A1 | 4/2017 | Kawasaki |
| 2019/0122864 | A1 | 4/2019 | Aramaki et al. |
| 2019/0157040 | A1 * | 5/2019 | Fairbairn .......... H01J 37/32146 |
| 2020/0075290 | A1 | 3/2020 | Kawasaki et al. |
| 2021/0166917 | A1 | 6/2021 | Van Zyl |
| 2021/0202209 | A1 | 7/2021 | Van Zyl et al. |
| 2022/0013330 | A1 | 1/2022 | Driessen et al. |
| 2023/0268162 | A1 | 8/2023 | Van Zyl et al. |
| 2025/0316451 | A1 | 10/2025 | Brouk et al. |

FOREIGN PATENT DOCUMENTS

| | | | | | |
|---|---|---|---|---|---|
| JP | 2002218278 | A | * | 8/2002 | |
| JP | 2005-045291 | A | | 2/2005 | |
| JP | 2005-250235 | A | | 9/2005 | |
| JP | 2009-246091 | A | | 10/2009 | |
| JP | 2010-016319 | A | | 1/2010 | |
| JP | 2011-015216 | A | | 1/2011 | |
| JP | 2011035266 | A | | 2/2011 | |
| JP | 2011-228436 | A | | 11/2011 | |
| JP | 2011-529273 | A | | 12/2011 | |
| JP | 2013-254750 | A | | 12/2013 | |
| JP | 2014-505362 | A | | 2/2014 | |
| JP | 2015534718 | A | | 12/2015 | |
| JP | 5981944 | B2 | * | 8/2016 | ........... A61B 5/6803 |
| JP | 2016-225376 | A | | 12/2016 | |
| KR | 10-2013-0085955 | A | | 7/2013 | |
| KR | 10-2015-0047522 | A | | 5/2015 | |
| TW | I591678 | B | | 7/2017 | |
| TW | 201937532 | A | | 9/2019 | |
| TW | 202035747 | A | | 10/2020 | |
| WO | 9928524 | A1 | | 6/1999 | |
| WO | 2011/156813 | A1 | | 12/2011 | |
| WO | 2014035899 | A1 | | 3/2014 | |
| WO | 2019099925 | A1 | | 5/2019 | |

OTHER PUBLICATIONS

Hammond, Crystal L, Office Action issued in U.S. Appl. No. 17/181,382, May 9, 2024, 119 pages.

TIPO, Office Action issued in Taiwan Patent Application No. 113114294, Mar. 24, 2025, 19 pages.

Office Action received for Japanese Application No. 2024179980 dated Jul. 24, 2025, 2 pages.

Office Action received for Taiwan Application No. 111105676 dated Jun. 12, 2025, 14 pages.

Office Action received for Japanese Application No. 2023088417 dated Jun. 3, 2025, 9 pages.

Notice of Allowance received for U.S. Appl. No. 17/678,604 dated Jul. 25, 2025, 12 pages.

Notice of Allowance received for U.S. Appl. No. 18/198,788 dated Aug. 26, 2025, 7 pages.

Office Action received for U.S. Appl. No. 17/245,825 dated Oct. 1, 2025, 58 pages.

Extended European Search Report and Search Opinion received for European Application No. 25197053.9, mailed on Dec. 18, 2025, 10 pages.

Non-Final Office Action received for U.S. Appl. No. 18/925,583, mailed on Jan. 28, 2026, 14 pages.

Notice of Allowance received for U.S. Appl. No. 17/678,604, mailed on Nov. 24, 2025, 11 pages.

Notice of Allowance received for U.S. Appl. No. 18/198,788, mailed on Nov. 5, 2025, 8 pages.

Office Action received for Korean Patent Application No. 10-2025-7014349, mailed on Jan. 21, 2026, 13 pages (6 pages of English Translation and 7 pages of Original Document).

Decision to Grant received for Japanese Patent Application No. 2023-088417, mailed on Nov. 11, 2025, 4 pages (2 pages of English Translation and 2 pages of Original Document).

Final Office Action received for U.S. Appl. No. 17/245,825, mailed on Apr. 29, 2026, 24 pages.

Notice of Allowance received for U.S. Appl. No. 18/925,583, mailed on May 13, 2026, 9 pages.

Office Action received for Japanese Patent Application No. 2020-545048, mailed on Apr. 27, 2026, 4 pages.

Office Action received for Japanese Patent Application No. 2024-179980, mailed on Feb. 2, 2026, 8 pages (3 pages of original office action and 5 pages of English Translation).

Office Action received for Korean Patent Application No. 10-2025-7004612, mailed on Dec. 5, 2025, 7 pages (3 pages of English Translation and 4 pages of Original Document).

Office Action received for Korean Patent Application No. 10-2025-7034804, mailed on May 11, 2026, 12 pages (5 pages of English Translation and 7 pages of Original Document).

Office Action received for Taiwanese Patent Application No. 111104737, mailed on Oct. 15, 2025, 25 pages (13 pages of English Translation and 12 pages of Original Document).

* cited by examiner

INTEGRATED CONTROL OF A PLASMA PROCESSING SYSTEM

CLAIM OF PRIORITY UNDER 35 U.S.C. § 120

The present Application for Patent is a Continuation of patent application Ser. No. 17/181,382 entitled "INTEGRATED CONTROL OF A PLASMA PROCESSING SYSTEM", filed Feb. 22, 2021 which is a Continuation-in-Part of patent application Ser. No. 17/031,027 entitled APPLICATION OF MODULATING SUPPLIES IN A PLASMA PROCESSING SYSTEM, filed Sep. 24, 2020, which is a Continuation of patent application Ser. No. 16/194,125 entitled "APPLICATION OF MODULATING SUPPLIES IN A PLASMA PROCESSING SYSTEM" filed Nov. 16, 2018 and issued as U.S. Pat. No. 10,811,227 on Oct. 20, 2020, which claims priority to Provisional Application No. 62/588,255 entitled "IMPROVED APPLICATION OF AN EV SOURCE IN PLASMA PROCESSING EQUIPMENT" filed Nov. 17, 2017, and assigned to the assignee hereof and hereby expressly incorporated by reference herein.

BACKGROUND

Field

The present disclosure relates generally to plasma processing. In particular, but not by way of limitation, the present disclosure relates to interoperation of equipment coupled to a plasma processing system.

Background

Plasma processing systems for etching and deposition have been utilized for decades, but advancements in processing techniques and equipment technologies continue to create increasingly more complex systems. At the same time, the decreasing dimensions of structures created with workpieces requires increasingly precise control and interoperation of plasma processing equipment. Current control methodologies and associated systems are not capable of addressing several issues that are associated with the complex systems of today and tomorrow; thus, there is a need for new and improved control over disparate, yet interdependent, plasma processing equipment.

SUMMARY

According to an aspect, a power delivery system comprises at least one modulating supply configured to provide power to a plasma load. The modulating supply modulates plasma properties where the modulation of the plasma properties has a repetition period, T. The system also comprises a match network configured to impedance match an output of the modulating supply to the plasma load; a first sensor configured to measure at least one parameter of the power at an output of the modulating suppl; and a controller. The controller is configured to receive the measured parameter signal from the sensor; receive a user power delivery requirement; analyze the at least one of measured parameter signal and the user power delivery requirement; instruct one or more of the modulating supply or the match network to adjust one or more operating parameters in order to meet the user power delivery requirements; and send a synchronization signal with a synchronization signal repetition period that is an integer multiple of T to at least one piece of equipment connected to the plasma system to synchronize the modulating supply and the at least one piece of equipment.

Another aspect may be characterized as a non-transitory, tangible processor readable storage medium encoded with instructions comprising instructions to monitor electrical characteristics of a power output of a modulating supply that modulates plasma properties where the modulation of the plasma properties has a repetition period, T; provide the electrical characteristics of the power output to a controller; and analyze the electrical characteristics of the power output. The characteristics of a characterized waveform with the repetition period T are communicated to at least one piece of equipment connected to plasma processing system to enable synchronization of pieces of equipment connected to the plasma processing system, and instructions are relayed to the modulating supply and a match network, based on the analyzing of the electrical characteristics, enabling simultaneous tuning of the modulating supply and the match network.

Yet another aspect may be characterized as a power control system of a power delivery system. The power delivery system comprises a first sensor configured to monitor power output of a modulating supply and impedance seen by the modulating supply, wherein the modulating supply is configured to provide power to a plasma via a match network that modulates the plasma. The power delivery system also comprises a controller in communication with the first sensor. The controller is configured to manage tuning of the modulating supply and the match network, where the tuning accounts for the power output of the modulating supply and the impedance seen by the modulating supply and characterize a waveform with a repetition period, T, containing at least one of information about the modulation of the plasma or a desired waveform of a piece of equipment connected to a plasma processing system to produce a waveform dataset. The controller is also configured to send the waveform dataset to at least one piece of equipment connected to the plasma processing system.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments of the present invention. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

While the following disclosure generally refers to wafer plasma processing, implementations can comprise any substrate processing within a plasma chamber. In some instances, objects other than a substrate can be processed using the systems, methods, and apparatus herein disclosed. In other words, this disclosure applies to plasma processing of any object within a sub-atmospheric plasma processing chamber to effect a surface change, subsurface change, deposition or removal by physical or chemical means.

This disclosure may utilize plasma processing and substrate biasing techniques as disclosed in U.S. Pat. Nos. 9,287,092, 9,287,086, 9,435,029, 9,309,594, 9,767,988, 9,362,089, 9,105,447, 9,685,297, 9,210,790. The entirety of these applications is incorporated herein by reference. But it should be recognized that the reference in this specification to any prior publication (or information derived from it), or to any matter which is known, is not an acknowledgment or admission or any form of suggestion that the prior publication (or information derived from it) or known matter is conventional, routine, or forms part of the common general knowledge in the field of endeavor to which this specification relates.

For the purposes of this disclosure, source generators are those whose energy is primarily directed to generating and sustaining the plasma, while "bias supplies" are those whose energy is primarily directed to generating a surface potential for attracting ions and electrons from the plasma.

Figure 1:
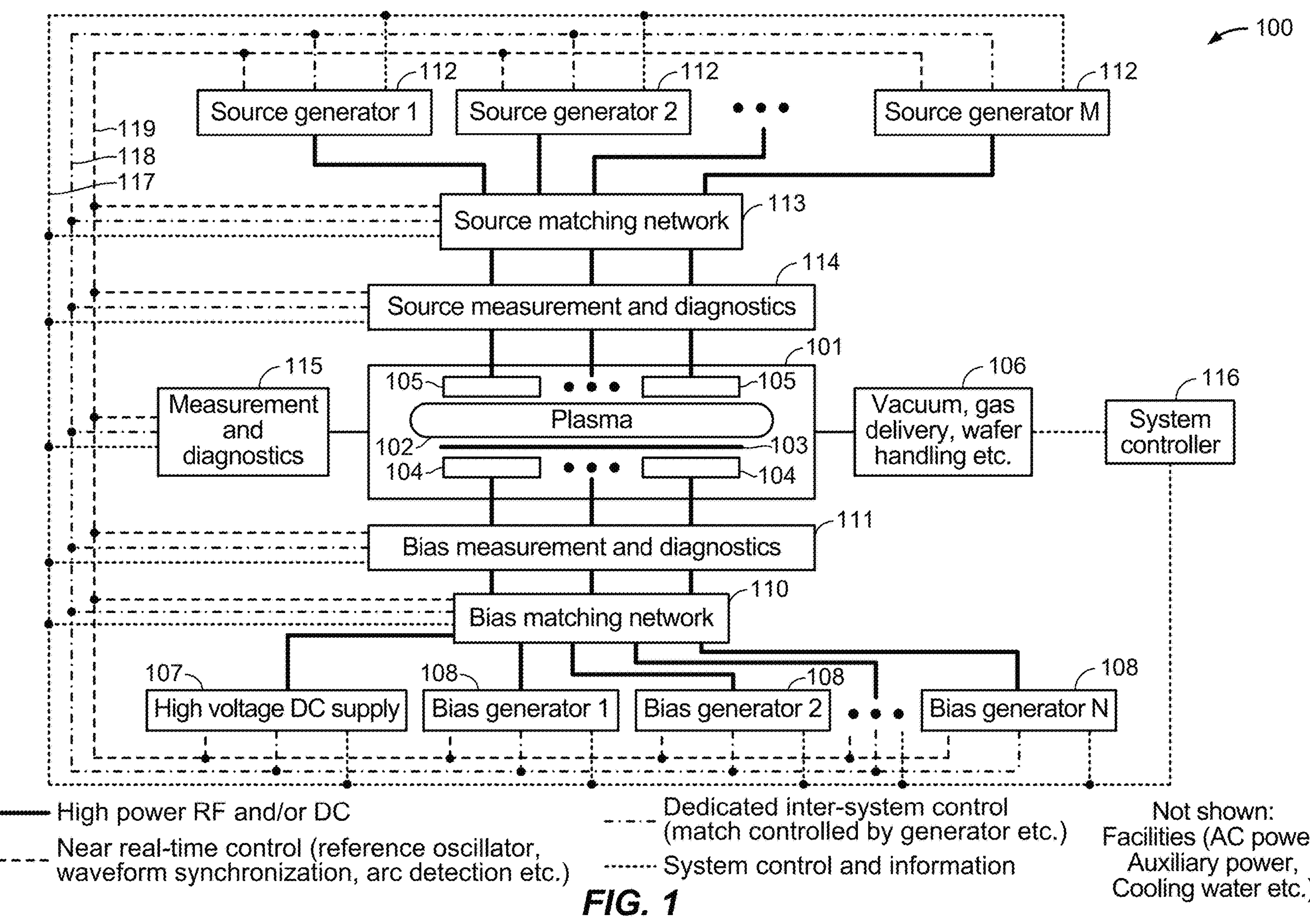
FIG. 1 depicts an embodiment of a plasma processing system designed to achieve control over plasma properties.

FIG. 1 shows an embodiment of a plasma processing system with many pieces of equipment coupled directly and indirectly to plasma chamber 101, which contains a plasma 102. The equipment comprises vacuum handling and gas delivery equipment 106, bias generators 108, a bias matching network 110, bias measurement and diagnostics system 111, source generators 112, a source matching network 113, source measurement and diagnostics system 114, measurement and diagnostic equipment 115, and a system controller 116. The embodiment in FIG. 1, and other embodiments described herein, are exemplary of the complexity of plasma processing systems, and the depiction of plasma systems herein helps to convey the interrelations of the equipment coupled to the plasma chamber 101.

An example of the interrelations of the plasma processing equipment is the effect that modulating supplies (e.g., source generators 112, bias generators 108, and other modulating supplies discussed further herein) have on plasma properties (and control of the same). More specifically, modulating supplies can cause strong modulation of plasma properties such as the impedance presented by the plasma 102 to equipment of the plasma processing system 100. Plasma modulation can also cause aliasing of measurements of plasma properties. Additional details about the effects of modulation of plasma properties are discussed further herein.

Shown in FIG. 1 is a plasma processing system 100 (e.g., deposition or etch system) containing a plasma chamber 101 within which a workpiece (e.g., a wafer) 103 is contained. A number of bias electrodes 104 are connected through the bias measurement and diagnostics system 111 to the bias match network 110 to which a number of bias generators 108 are connected. The bias electrodes 104 may be built into an electrostatic chuck to hold the workpiece 103 in place. This may involve integration of a high voltage DC power supply 107 into the system. In many applications, a single bias electrode 104 is used, but utilization of many bias electrodes 104 may be used to achieve a desired spatial control.

The bias generators 108 depicted in FIG. 1 may be lower frequency (e.g., 400 kHz to 13.56 MHz) RF generators that apply a sinusoidal waveform. Also shown is a set of source electrodes 105 connected to a number of source generators 112 through the source measurement and diagnostics system 114 and source matching network 113. In many applications, power from a single source generator 112 is connected to one or multiple source electrodes 105. The source generators 112 may be higher frequency RF generators (e.g. 13.56 MHz to 120 MHz). Vacuum maintenance, gas delivery and wafer handling equipment 106 may be implemented to complete the system and optionally additional measurement and diagnostic equipment 115 may be present (e.g. optical spectroscopy equipment).

The system controller 116 in the embodiment of FIG. 1 controls the entire system through a system control bus 117. The system control bus 117 can also be used to collect information from equipment of the plasma processing system. In addition to the system control bus 117, there may be dedicated inter-system communication 118 which can be used, for example, to control the source matching network 113 from a source generator 112 or exchange information between subsystems without involving the system control bus 117. There may also be a near-real-time communication link 119 between subsystems. This may take the form of a reference oscillator to phase lock different generators on the system, to provide waveform synchronization signals, arc detection signals, etc. Although a single source generator 112 is common, it is also common to have multiple source generators 112 and multiple bias generators 108 in order to achieve a desired plasma density and desired control over the distribution of ion energies. One or more of the source generators 112 and/or bias generators 108 can modulate the plasma properties and be considered as a modulating supply.

Figure 2:
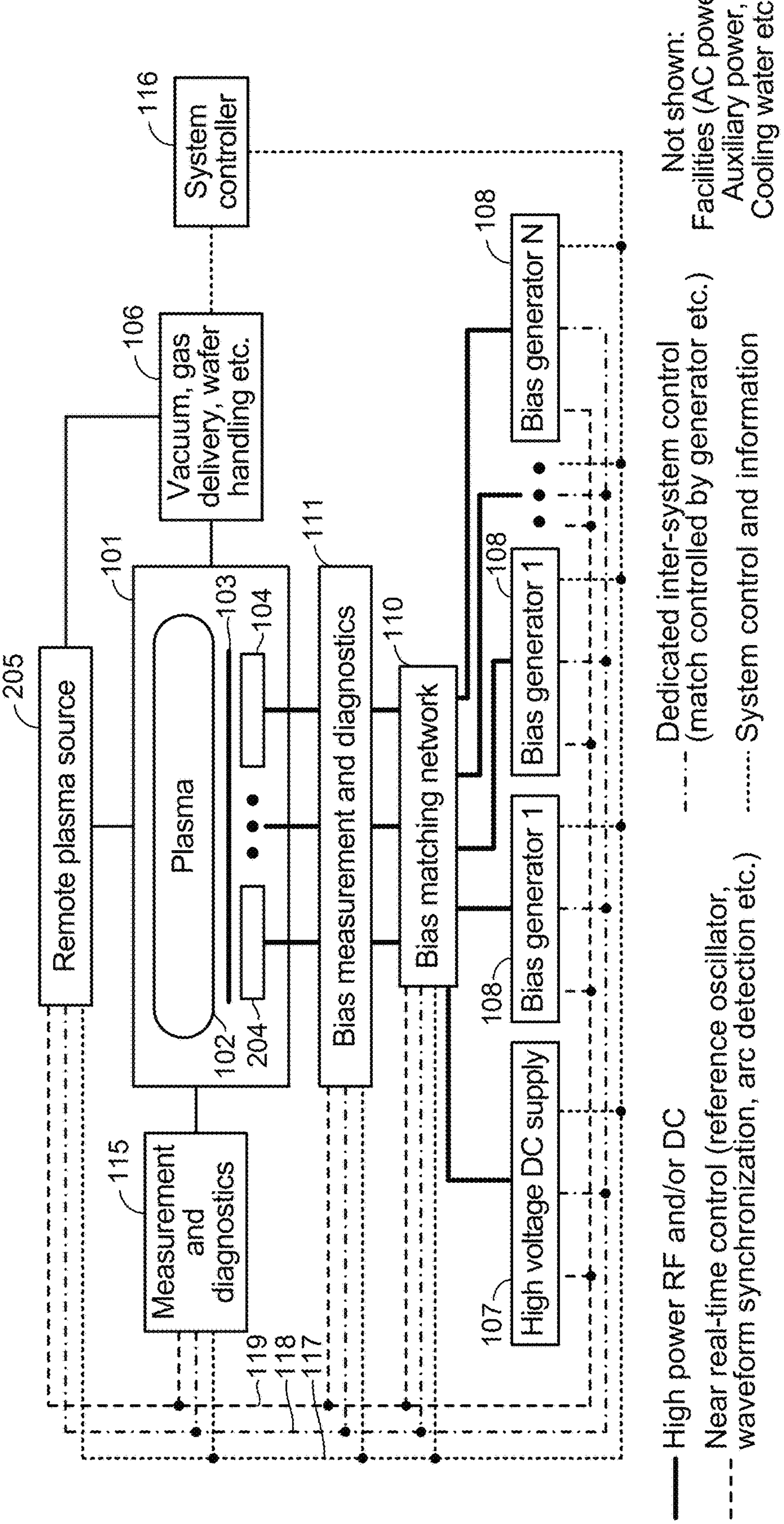
FIG. 2 depicts another embodiment of plasma processing system designed to achieve control over plasma properties using a remote plasma source rather than a source generator or source generators.

FIG. 2 shows an embodiment of a plasma processing system 200 where the source generators 112 are replaced by a remote plasma source 205. As those of ordinary skill in the art will appreciate, the remote plasma source 205 may comprise an excitation source (e.g., an RF generator) and a plasma-generation chamber configured and disposed to produce a plasma that is provided to the plasma chamber 101. Although the remote plasma source 205 is outside of the plasma chamber 101, the remote plasma source 205 may be coupled to the plasma chamber 101 to form a contiguous volume with the plasma chamber 101. Although unlikely in many embodiments, in some embodiments, the remote plasma source 205 may modulate plasma properties of the plasma 102 in the plasma chamber 101. And if the remote plasma source 205 does modulate the plasma properties of the plasma 102, the remote plasma source 205 and/or one or more of the bias generators 108 can be considered as a modulating supply.

Figure 3:
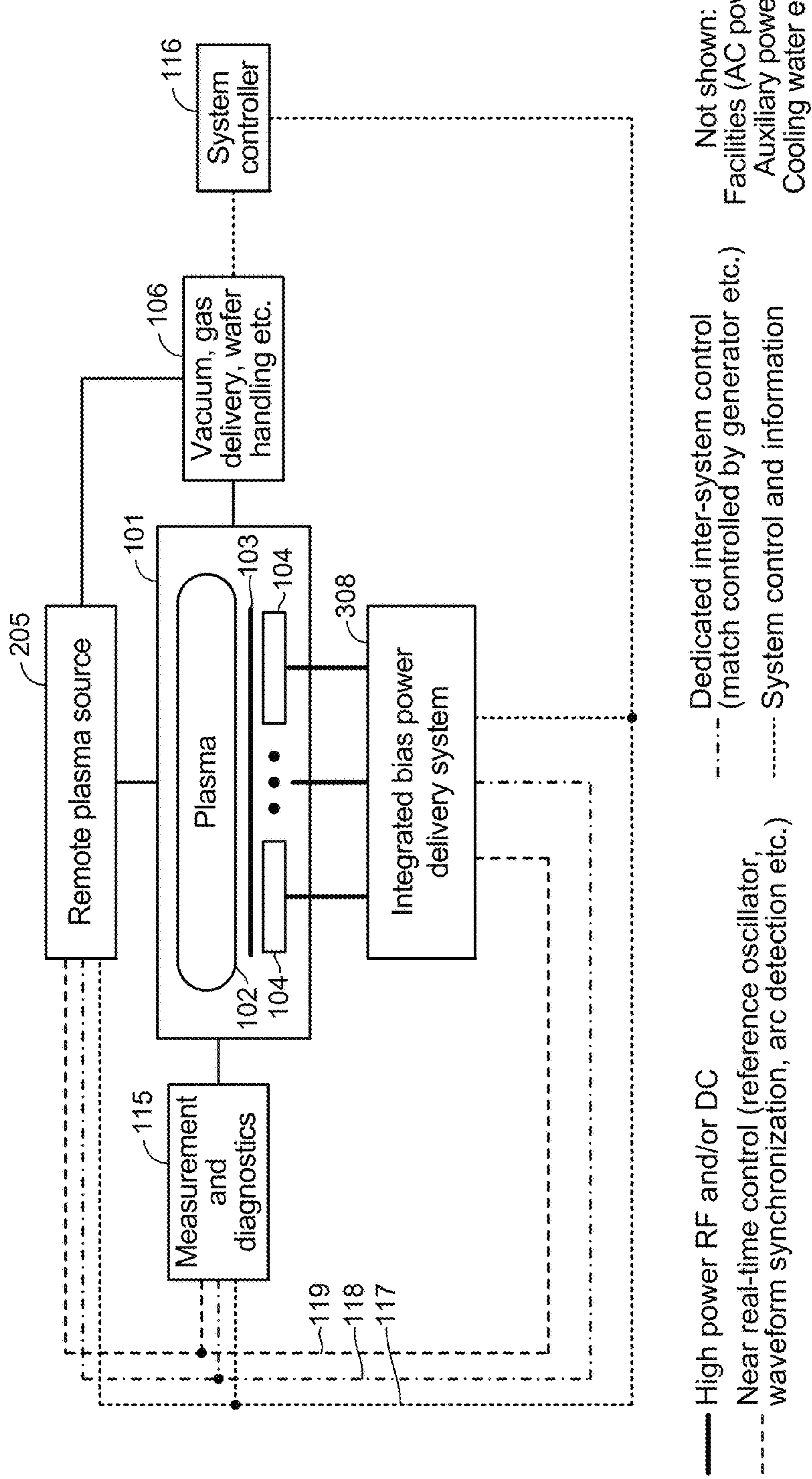
FIG. 3 depicts yet another embodiment of a plasma processing system designed to achieve control over plasma properties using a remote plasma source and an integrated bias power delivery system.

FIG. 3 shows another embodiment of a plasma processing system where multiple bias generators are replaced by an integrated bias power delivery system 308. Such integration can reduce system complexity and reduce duplication by, for example, using common DC power supplies for the RF generators, a common controller, auxiliary power supplies, measurement systems etc., but the output to the plasma chamber 101 is still a combination of a single or multiple RF frequencies and/or a DC signal. Many other variations exist such as, for example, using a source generator and integrated bias power delivery system or using integrated source and bias power delivery systems etc.

Figure 4:
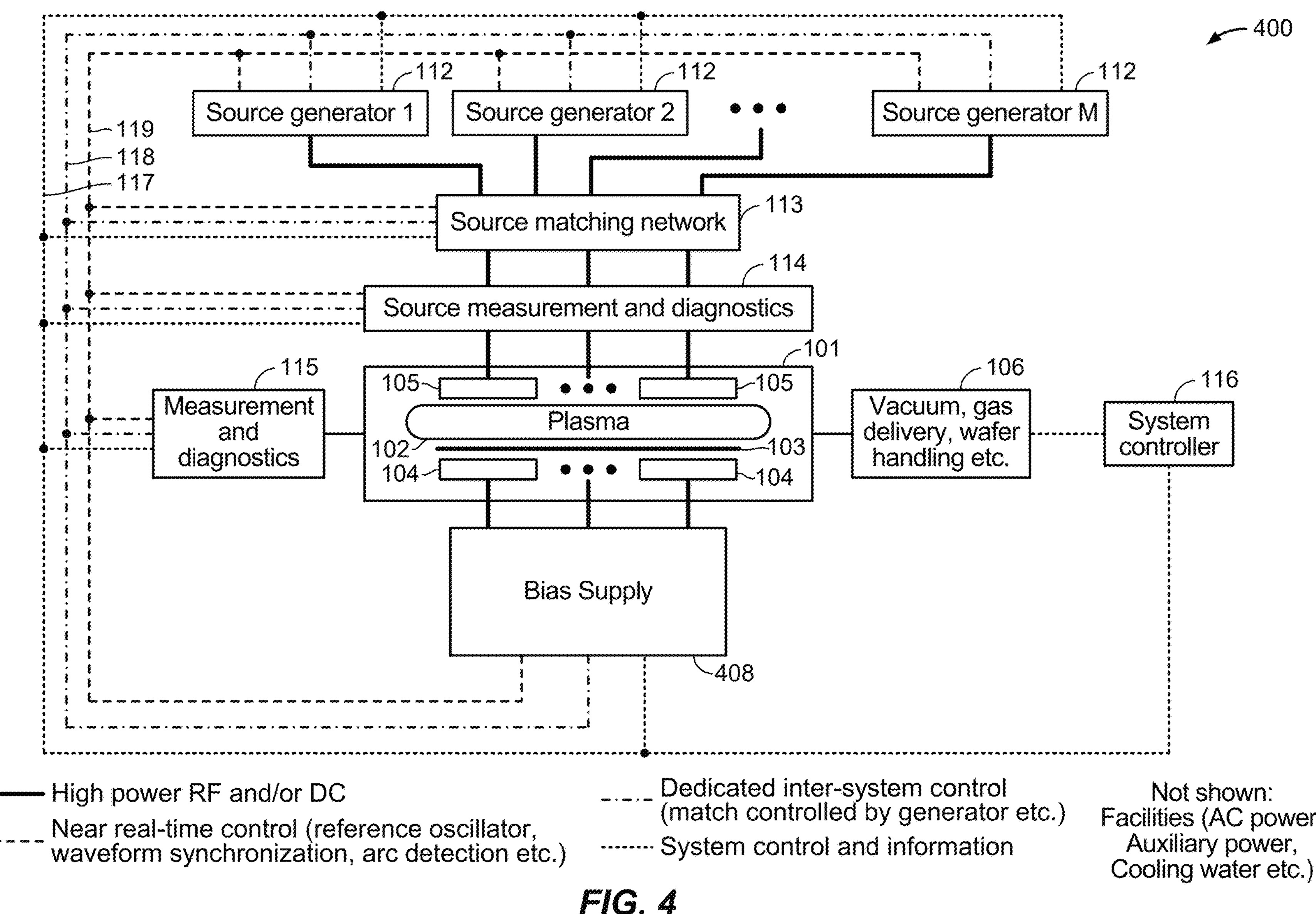
FIG. 4 depicts a plasma processing system that comprises a bias supply.
Figure 5:
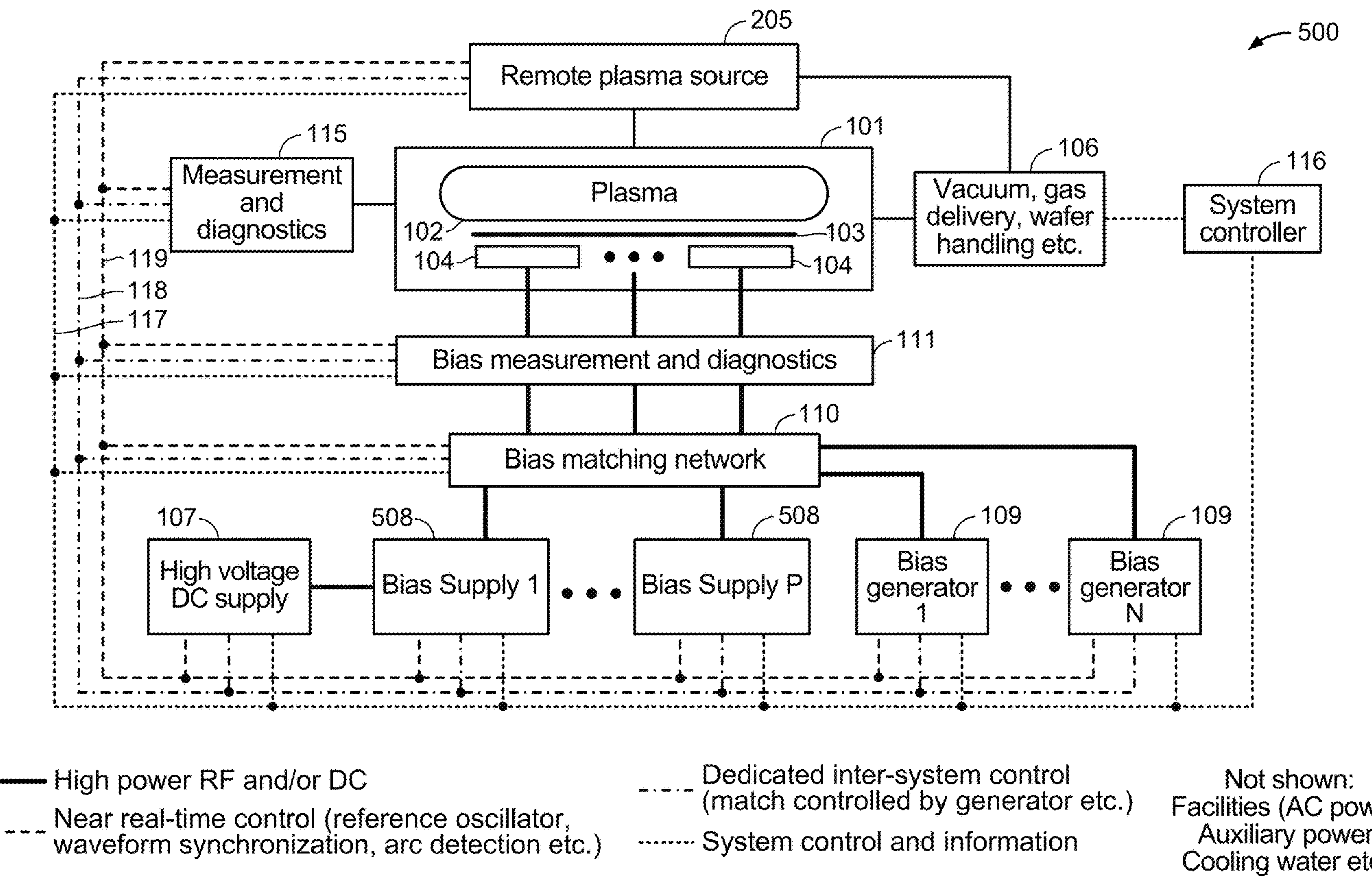
FIG. 5 depicts another implementation of a plasma processing system incorporating multiple bias supplies.

Referring next to FIG. 4, shown is yet another embodiment of a plasma processing system that utilizes a bias supply 408 (instead of bias generators 108) for an even tighter control over the distribution of ion energies. As shown, the bias supply 408 may apply a periodic waveform to several different electrodes 104, or alternatively, a separate bias supply 408 may be coupled to each electrode 104 (not shown in FIG. 4). As shown in FIG. 5, it is contemplated that multiple bias supplies 508 may be utilized in connection with multiple generators 109. It should be recognized that the embodiments described with reference to FIGS. 1-5 are not mutually exclusive and that various combinations of the depicted equipment may be employed.

Aspects of the present disclosure address challenges faced in the prior art by recognizing that traditional and even cutting edge components of plasma processing systems are still limited by their autonomous design. For example, bias supplies, source generators and match networks are often independently operated. This disclosure describes systems, methods, and apparatuses for integrating communication, measurement, and control amongst components of a power delivery system (also known as a power generation and delivery system). Some advantages of this approach comprise the ability to provide accurate power regulation over a wide dynamic range, faster power stabilization during transients, and decreased reflected power, for both pulsed and continuous wave (CW) power.

Figure 6A:
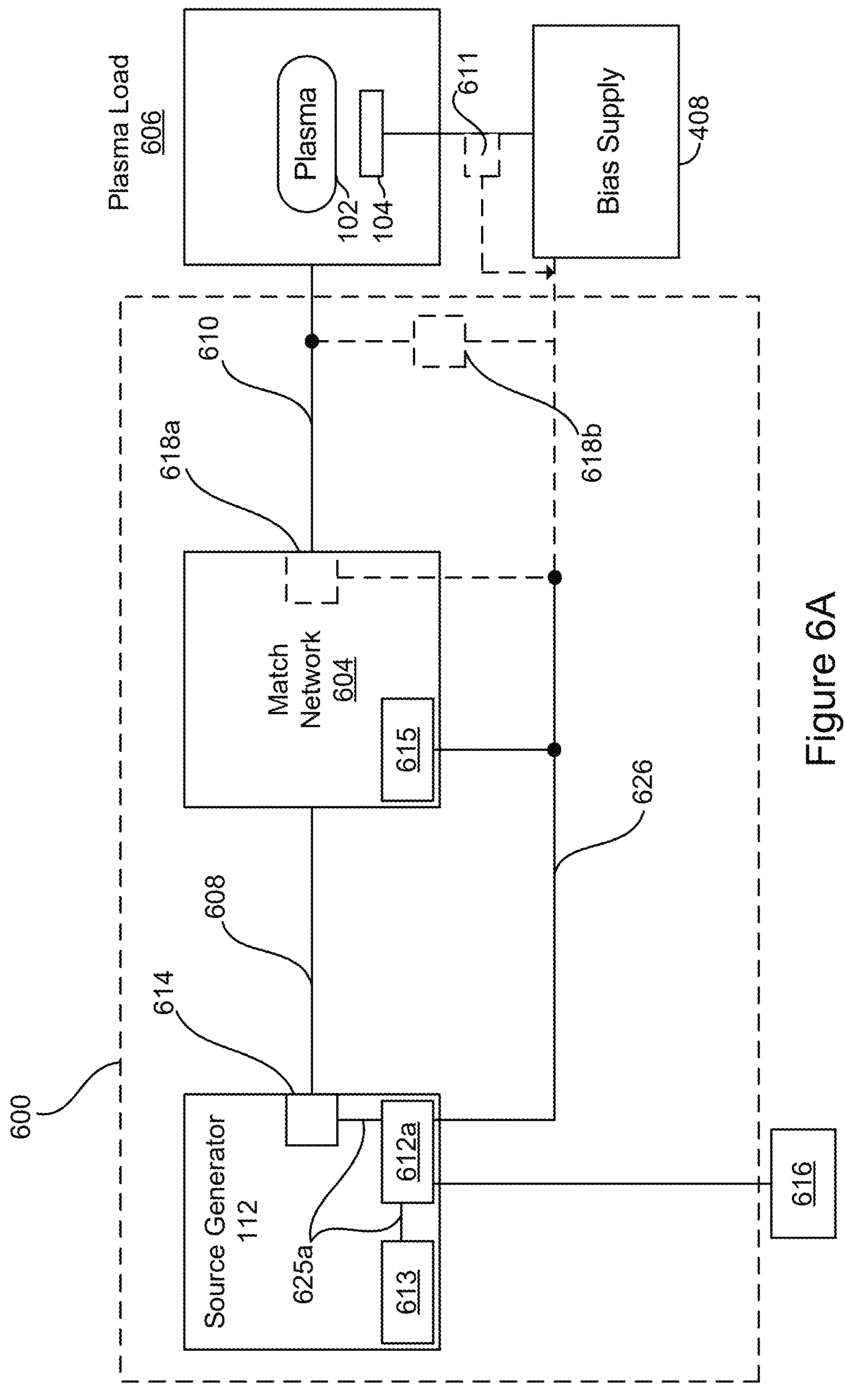
FIGS. 6A, 6B, and 6C illustrate embodiments of a power delivery system for a plasma processing system.
Figure 6B:
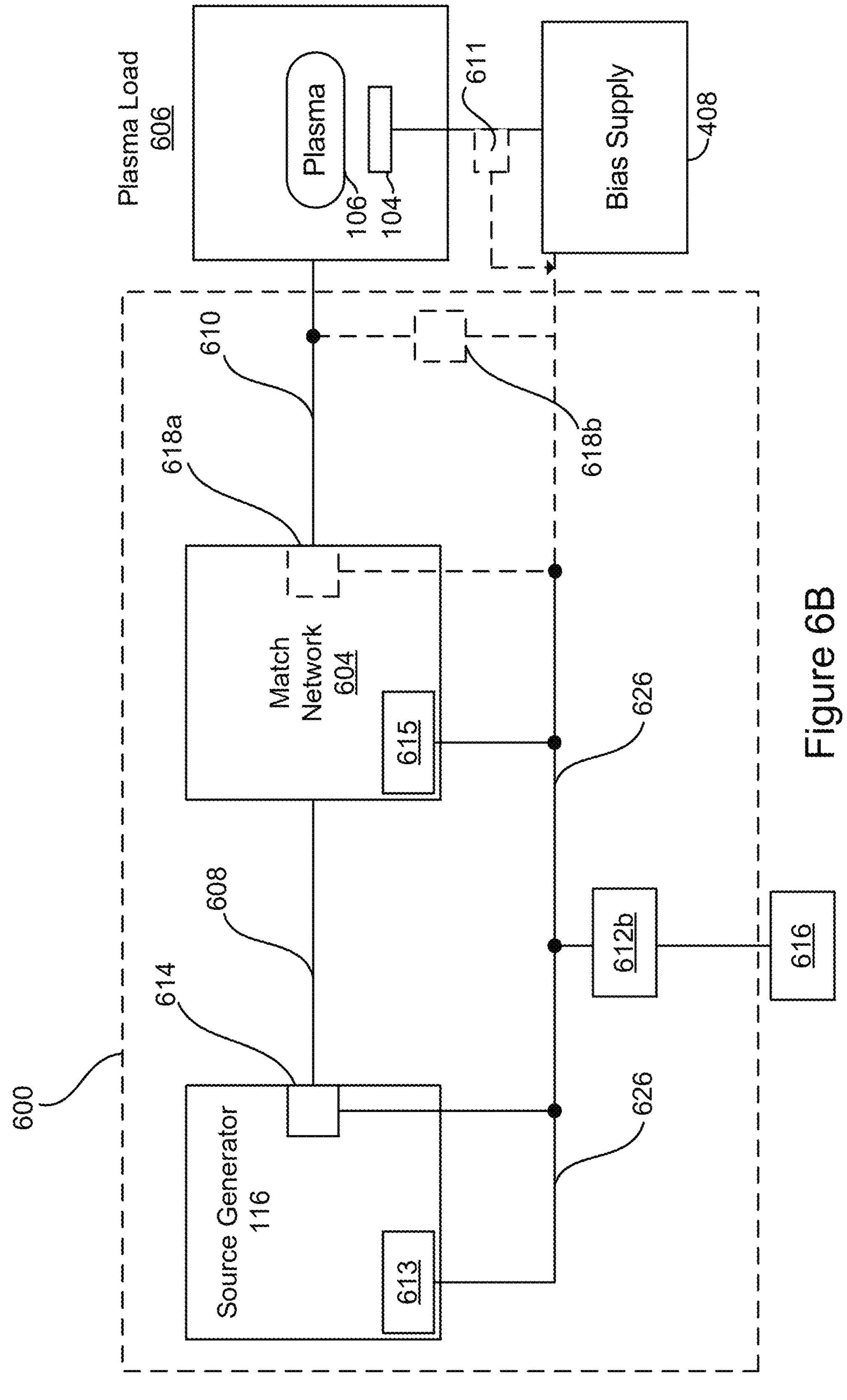
Figure 6C:
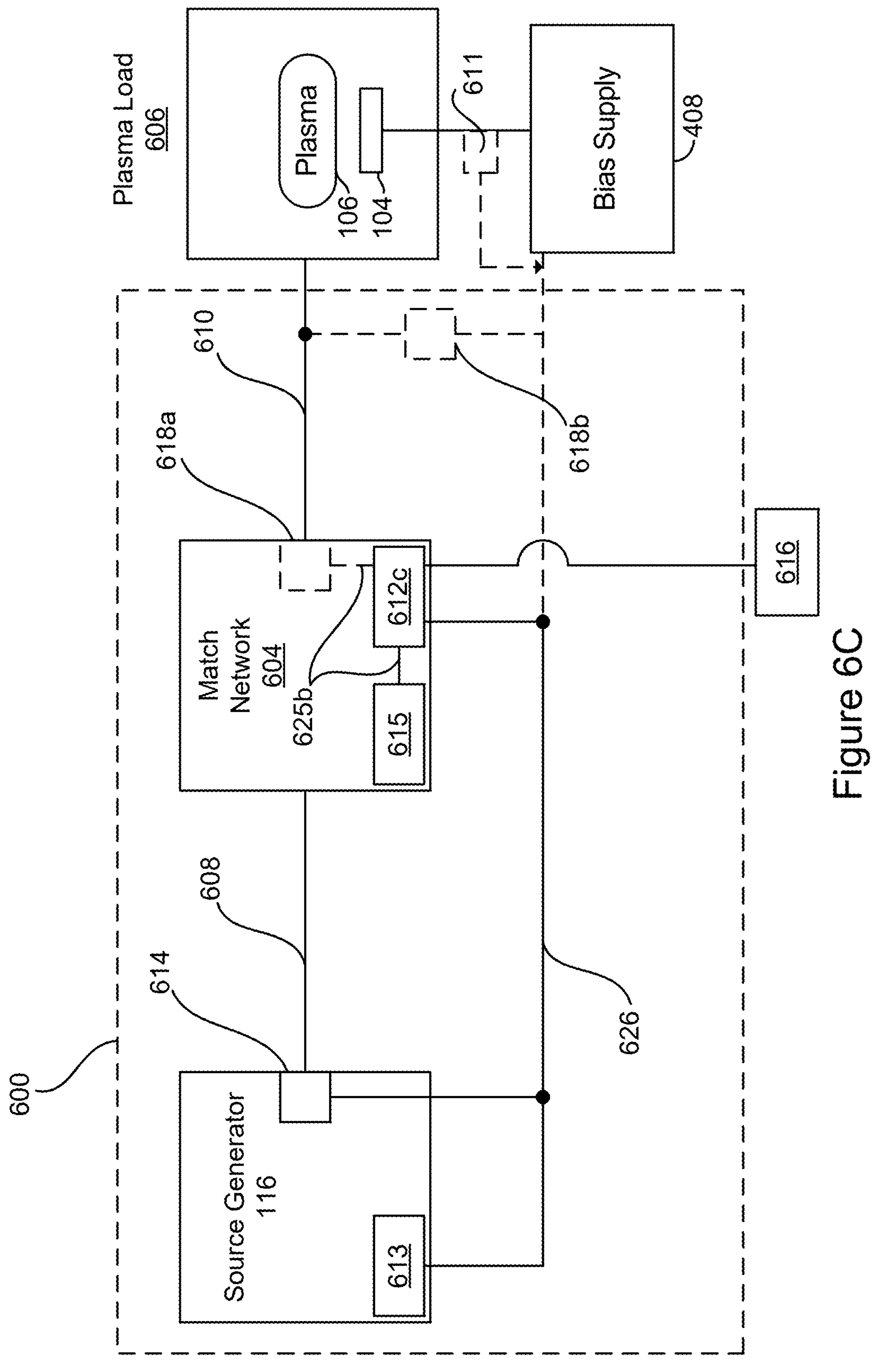

FIGS. 6A to 6C illustrate aspects of power delivery systems that may be utilized in connection with the plasma processing systems described with reference to FIGS. 1-5. The power delivery system 600 provides power (e.g., via inductive coupling and/or capacitive coupling) to a plasma 102, where a match network 604 may minimize reflected power and/or achieve a stable plasma. A power output of the source generator 112 is provided to the match network 604 via a first transmission medium 608 and then on to the plasma 102 (of a plasma load 606) via a second transmission medium 610. A first sensor 614 and optional second 618 and third 611 sensors monitor electrical characteristics of the power by measuring one or more of voltage, current, phase, impedance, and power and pass (or relay) this information to a local controller. The local controller 612 resides in either the bias supply 408, the source generator 112, or the match network 604 (see FIG. 6C), or anywhere within the power delivery system 600 (see FIG. 6C), and manages communication between the bias supply 408, source generator 112, the match network 604, and one or more of the sensors 611, 614, 618. The local controller 612 can also manage communication between a user and any components of the power delivery system 600. The local controller 612 can manage the power delivery system 600 so that rapidly-adjustable, constant, and accurate power is delivered to the plasma 102 according to one or more power delivery requirements.

The one or more sensors 611, 614, 618 monitor the power for the local controller 612. In particular, the first sensor 614 can monitor a power output of the source generator 112 as well as an impedance seen by the source generator 112. The local controller 612 analyzes measurements provided by the first sensor 614 (and optionally also the second sensor 618) in light of the power delivery requirements. It can determine operating parameters for the source generator 112 and match network 604 judged sufficient to meet the power delivery requirements, and can instruct (or relay instructions to) the source generator 112 and the match network 204 to adjust internal parameters of those components in order to meet the power delivery requirements.

In addition, in some implementations, the local controller may be configured to operate with the functionality of the system controller 116. It is also contemplated that the external controller 616 may be configured to operate with the functionality of the system controller 116. Moreover, the functionality of the system controller 116 may be implemented across one or more local controllers 612 and one or more system controllers 616. Thus, the aspects of integrating communication, measurement, and control amongst components of a power delivery system (described with reference to FIGS. 6A to FIG. 9 may be utilized in connection with the embodiments and implementations described with reference to FIGS. 1-5 to control and synchronize equipment of plasma processing systems. The local controllers 612 and external controllers 616, 716, 816, 916 may also provide additional functionality to augment the control methodologies described with reference to FIGS. 1-5.

This unified power delivery system 600, or the herein disclosed use of a local controller 612 in conjunction with the first sensor 614 (and optionally the second sensor 618 and third sensor 611), has a number of advantages. First, by unifying control and operation of various components of the power delivery system 600, novel power delivery methods are enabled, such as the ability to simultaneously tune the match network 604 and the source generator 112 or tune the match network 604 while pulsing or changing the waveform of the source generator 112 output. Second, this system and approach enables rapidly-adjustable, accurate, and consistent power delivery to the plasma 102. The speed of the power delivery system 600 is particularly useful in dynamic power applications (e.g., pulsed source generator 112 output).

The ability to more rapidly adjust power delivery can in part be attributed to avoidance of delays that traditional systems see when sensors must first measure frequency before measuring impedance. The local controller 612 may provide the first sensor 614 with operating parameters of the generator, such as frequency, so that the first sensor 614 need not measure frequency before beginning to sample for impedance. Earlier sampling means that impedance can be determined faster than in the art. The local controller 612 can also provide the first sensor 614 with an indication of the start of pulsing or a change in a power waveform, thus preventing the first sensor 614 from having to detect such a change before sampling begins. This also enables the first sensor 614 to begin measuring impedance sooner than sensors in the art.

The power delivery system 600 also improves the accuracy of power delivery. For example, when multiple sensors are used to measure power and impedance each sensor has an error function associated with that sensor resulting from calibrations that are made to each sensor. By using a single sensor 614 to measure power and impedance, only a single calibration is performed, and therefore less error is introduced.

In addition, having a greater number of sampling points can improve impedance measurements. In the art, sampling typically can only begin after a pulse or change in the generator waveform has been detected, whereas here, the local controller 612 may indicate to the first sensor 614 a start of a pulse or change in the source generator 112 waveform before or when the pulse or waveform change occurs. As such, the first sensor 614 can begin sampling earlier than is possible in the art, thus enabling more accurate impedance measurements.

Moreover, a measure of impedance depends on the frequency of the signal being measured; thus, errors in measuring frequency translate to errors in the impedance that is measured. Prior art impedance measurements are often made after a sensor in the match network measures frequency, thus introducing unnecessary error. Alternatively, when using a broadband sensor, error is introduced by analog variation in the broadband sensor as a function of frequency. By making the first sensor 614 aware of the frequency that the source generator 112 is producing, rather than requiring the first sensor 614 to measure the frequency at the match network, the first sensor 614 sees less error in impedance measurements than sensors in the prior art. Also, because the first sensor 614 does not have to measure frequency, it can take more samples, and a larger sample size improves accuracy.

In addition, because every component (e.g., source generator 112, first sensor 614, match network 604, optional second sensor 618) in a power delivery system is different, operating parameters of a power delivery system are preferably adjusted when different components are substituted. Traditional power supplies do not account for variations between components. In contrast, the local controller 612 is aware of the various components of the power delivery system 600 and adjusts its instructions to the source generator 112 and the match network 604 accordingly.

Component variations can be taken into account by identification of the components to the local controller 612. For instance, the bias supply 408, source generator 112, and/or match network 604 can identify themselves to the local controller 612 via brand, model, serial number or other identifying information. Also, they can provide operating characteristics such as status, set point (e.g., power level, frequency, etc), repetition period T, and configuration, to name a few. This can be done via the RF engine 613 and the impedance control system 615, respectively. The first and second sensors 614, 618 can also identify themselves to the local controller 612. Authentication may take place via an authentication algorithm. As such, in one embodiment, only specific types or brands of bias supply 408, source generator 112, and match network 604 are operable when connected via the transmission medium 608. The local controller 612 can also query the bias supply, source generator 112, the match network 604, and the sensors 614, 618 to determine their unit type, serial number, part number, or any other identifying information. With this knowledge, the local controller 612 can tailor instructions to the source generator 112, bias supply 408, and/or the match network 604 to account for variations in components, thus allowing the power delivery system 600 to provide more accurate and consistent power than is possible in the art.

The power delivery system 600 also improves the consistency (or quality) of power delivery because of the ability to measure both power and impedance. In part, consistency is improved via the greater accuracy described above (e.g., decreased error stack-up and earlier and more extensive sampling). Consistency is also improved, because, where the prior art had difficulty maintaining stability in multiple control loops of a power delivery system, the single controller 612 can control the multiple control loops and ensure stability and synchronization between the control loops.

A number of design aspects enable these advantages. For example, a single sensor 614 may be used to monitor both power output of the source generator 112 and an impedance seen by the source generator 112. The first sensor 614 can measure voltage, current, phase, impedance, and power at an output of the source generator 112. The first sensor 614 can be arranged at an output of the source generator 112. The first sensor 614 can measure impedance seen by the source generator 112 in addition to power from the source generator 112 because of the ability to remotely measure impedance, a feature not possible in the art. Remote impedance measurements look at impedance at a location physically remote from the first sensor 614 (or the calibration point), for instance at a location some physical distance along the first transmission medium 608 from the first sensor 614 (e.g., at an input of the match network 604).

Inaccuracies in traditional impedance measurements meant that remote monitoring of impedance was difficult if not impossible. The first sensor 614 may overcome these challenges for several reasons. For example, the first sensor 614 may have a more linear response with respect to increasing voltage standing wave ratio referenced to the calibration impedance than sensors in the art, and in addition, the first sensor 614 may more closely measure a phase of the source generator 112 output power.

Typically, sensors can be calibrated to operate optimally close to a center operating impedance (e.g., 50Ω), but due to their nonlinear response to impedance variations, as impedance moves away from the calibration impedance, sensor accuracy degrades rapidly. This inaccuracy for physically local measurements is amplified when making measurements over large physical distances. In contrast, in many implementations, the sensor 614 has a more linear response on the voltage standing wave ratio circle, which enables accurate impedance measurements at impedances far from the impedance calibration point and therefore at physically remote locations.

In addition, the first sensor 614 may be able to more closely measure a phase of the source generator 112 output than could prior generations of sensors. In particular, at high phase angles there is extreme sensitivity to phase angle measurement accuracy, and hence, high sensitivity in the resulting impedance and power measurements. Since the first sensor 614 can more accurately measure phase angle, it is better able to remotely measure impedance.

In an embodiment, the first sensor 614 is a directional coupler. A directional coupler can measure the scaled power of forward and reverse power as well as the phase difference between them. The directional coupler can then pass the scaled power and phase difference back to the local controller 612. Scaled power is a voltage that the directional coupler provides to a measurement system that is proportional to an output voltage of the source generator 112 operating into its nominal load condition (e.g., 50Ω).

The advantages described above are secondly enabled by unified control and monitoring of the power delivery system 600 through a single local controller 612. The local controller 612 can receive and analyze information from the source generator 112, the match network 604, the first sensor 614, and the optional second sensor 618. The local controller 612 may run one or more algorithms to analyze information received regarding the power delivery system 600 and determines procedures to take in order to ensure consistent power delivery to the plasma 102. The local controller 612 can also issue instructions for other components in the power delivery system 600, such as the source generator 112 and match network 604, to carry out certain actions and procedures.

Since the local controller 612 monitors all measurements and distributes all control signals and instructions, many of an operator's responsibilities are alleviated and the speed with which the source generator 112 and match network 604 adjust to power and impedance fluctuations is enhanced. Such a configuration also simplifies the hardware requirements of the power delivery system 600 since fewer leads and signal lines are required. By minimizing the number of leads and signal lines, the source generator 112 and match network 604 can be controlled via smaller and less complex software and firmware.

Because the local controller 612 manages operation of both the source generator 112 and the match network 604, simultaneous tuning of those components is possible. The local controller 612 can instruct an RF engine 613 of the source generator 112 to adjust an amplitude, carrier frequency, power frequency, pulse width, pulse duty cycle, or waveform of the source generator 112 power output. The local controller 612 can also instruct an impedance control system 615 of the match network 604 to adjust an impedance of the match network 604, for instance by having a motor drive board adjust variable capacitors of the match network 604.

Available tuning options can dictate how the local controller 612 manages the power delivery system 600. Where the source generator 112 frequency is fixed, the local controller 612 can pass instructions to the match network 604 to adjust impedance. Where the source generator 112 frequency is variable, the local controller 612 can (1) pass instructions to the match network 604 to alter the impedance that the source generator 112 sees, (2) pass instructions to the source generator 112 to alter the power output frequency, or (3) pass instructions to the match network 204 to alter the impedance that the source generator 112 sees and to the source generator 112 to alter its power output frequency. Since the source generator 112 frequency is more quickly adjusted than the impedance of the match network 604, instructing the source generator 112 to tune via frequency in addition to or instead of the match network 204 adjusting impedance, can be preferable where fast tuning is required. In other words, impedance matching can be performed via simultaneous tuning of the source generator 112 and the match network 604.

More consistent and accurate power can be delivered when the local controller 612 takes into account information provided by the optional second sensor 618. For instance, the optional second sensor 618 can provide data characterizing the power delivered to the plasma 102; thus, enabling the local controller 612 to more accurately and consistently provide tuning instructions to the source generator 112 and the match network 604. Measurements from the optional second sensor 618 can also be used for chamber matching—to improve consistent power delivery between chambers operating in parallel, but each with a different power delivery system. The local controller 612 can also use these measurements to improve wafer to wafer consistency, uniform processing across the wafer surface, end point detection (e.g., via monitoring light emissions from the plasma), and arc management. Although not illustrated, in some embodiments, the optional second sensor 618 can be arranged within the plasma chamber or in contact with the wafer.

In an embodiment, the power provided to the plasma 102 may be altered for various setpoints (e.g., from a first setpoint to a second setpoint). The match network 604 may not be able to adjust fast enough to maintain consistent power delivery to the plasma 102 when the source generator 112 switches between power setpoints. To overcome this challenge, a test run can be used to determine preferred set points for the match network 604 corresponding to each source generator 112 set point. The test run happens before a device, semiconductor, or any other object to be processed, is placed in the plasma chamber. The match network 604 and source generator 112 are then tuned for the various source generator 112 set points. Parameters that can be tuned comprise source generator 112 frequency, pulse width, and match network 604 impedance. This tuning is carried out without anything in the chamber so that slow tuning can take place without harming the device in the chamber. Parameters that are determined to be preferred for various source generator 112 set points can be stored in a memory. During actual plasma processing, the local controller 612 can issue instructions for the source generator 112 and the match network 604 to operate at the preferred parameters associated with the various setpoints. In this way, the match network 604 and source generator 112 do not have to tune during processing, but rather can quickly be set to the preferred parameters as determined in the test run.

The local controller 612 can also take into account the following non-limiting aspects characterizing the power delivery system 600: component efficiency characteristics, control algorithm parameters, variable capacitor position in the match network 604, diagnostics such as faults and warnings, component health metrics, component history logs, and component status requests.

The local controller 612 can also take into account non-electrical characteristics of the plasma 102 when managing operations of the source generator 112 and the match network 604. For instance, the local controller 612*a* can consider chamber pressure, gas chemistry in the chamber, ion energy of the plasma, light intensity of the plasma, spectral content of light emitted by the plasma, and plasma arcing to name a few non-limiting examples. In an embodiment, the optional second sensor 618 can monitor non-electrical characteristics of the plasma 102 or the plasma processing chamber (not illustrated), such as chamber pressure, gas chemistry in the chamber, ion energy of the plasma, light intensity of the plasma, spectral content of light emitted by the plasma, and plasma arcing, to name a few non-limiting examples.

As illustrated, the local controller 612 is the lone conduit for user interaction with the power delivery system 600. In one embodiment, a user can interface with an external controller 616, which is in communication with the local controller 612. User control of the source generator 112 and match network 604 is made via the local controller 612 by way of the external controller 616. However, one of skill in the art will recognize that user interaction with the power delivery system is not necessarily limited to the local controller 612.

The first sensor 614 can optionally be implemented along with an optional second sensor 618 (or load sensor). The optional second sensor 618 can be arranged at an output of the match network 604 (618*a*) or somewhere between and including the match network 204 and the plasma 102 (618*b*). The optional second sensor 618 is configured to characterize the power delivered to the plasma 102 and can measure voltage, current, phase, impedance, or power at the output of the match network 604 or anywhere between the match network 604 and the plasma 102. In an embodiment, the optional second sensor 618 can be coupled to the plasma 102 and can be arranged within the plasma processing chamber or coupled to a wafer during processing.

The local controller 612 can manage communications between the source generator 112 (in particular, the RF engine 613), the first sensor 614, the match network 604 (in particular, the impedance control system 615), and the optional second sensor 618, between itself and these components, and between these components and a user (e.g., via the external controller 616). These communications can be made via signal paths 625*a* or 625*b* that are internal to the source generator 112 and match network 604 respectively, or via signal path 626, which is generally external to the source generator 112 and the match network 204 (although can comprise portions that are internal to the source generator 112 and the match network 604).

In the illustrated embodiment, the signal path 626 is a bus (signals can travel in both directions and multiple signals can travel along the same path). However, in other embodiments, various components can have their own signal paths to the local controller 612. In other embodiments, there can be more than one bus-type signal path, and in yet other embodiments there can be a combination of bus-like and non-bus signal paths.

In some embodiments, the signal path 626 can be replaced by communications via the transmission medium 608. In other words, communications from the optional second sensor 618 to the local controller 612 can be modulated on the power signal transmitted between the source generator 112 and the match network 604. Communications between the various components illustrated can be via a serial communication protocol such as RS-485. Alternatively, one or more of these communications can be made via a wireless connection or via a wired or wireless network. For instance, the signal path 626 can be implemented as a local area network (LAN).

Referring to FIG. 6B, the local controller 612*b* is arranged within the power delivery system 600, but is not a part of or connected to the source generator 112 or the match network 604. The local controller 612*b* can communicate with various components via a signal path 626, which is configured as a bus. Again, a bus configuration is not required, and each component can have an isolated signal path to the local controller 612*b*.

In FIG. 6C, the local controller 612*c* is coupled to or part of the match network 604. Again any combination of bus-type signal paths or isolated signal paths can be used. As illustrated, the optional second sensor 618 in a first position 618*a* and the impedance control system 615 communicate with the local controller 612*c* via signal paths 625*b* that are internal to the match network 604. The source generator 112 (in particular, the RF engine 613), the first sensor 614, and the optional second sensor 618 in alternative position 618*b*, communicate with the local controller 612*c* via the signal path 626 in a bus configuration.

The local controller 612, the RF engine 613, the first sensor 614, the impedance control system 615, and the optional second 618 and third 611 sensors can comprise any processor, such as, but not limited to, a central processing unit (CPU), a field programmable gate array (FPGA), a programmable logic device (PLD), a digital signal processor (DSP), or a combination of one or more CPU's, FPGA's, PLD's, and/or DSP's. Any of these components can comprise or be in communication with its own memory or a shared memory where the memory can be configured to store information such as configurations of the source generator 112, bias supply 408, and the match network 604 or trends in the power delivered to the plasma 102. The memory can be part of the local controller 612 or can be part of either the source generator 112 or the match network 604. In an embodiment, the memory can be a part of the RF engine 613 or the impedance control system 615.

The local controller 612 can comprise hardware, software, firmware, or a combination of these. For instance, the local controller 612 can comprise a processor, memory, and software running on the processor that is configured to analyze data from the first, second, and or third sensors 614, 618, 611 and determine how and when to instruct the source generator 112, match network 604, and/or bias supply 408 to adjust internal parameters of those components.

The RF engine 613, first sensor 614, impedance control system 615, and the optional second sensor 618 can each comprise logic such as a processor that receives instructions and transmits information to the local controller 612. Alternatively, the local controller 612 can handle all logic and control functions for each of the RF engine 613, first sensor 614, impedance control system 615, and the optional second sensor 618.

The power delivery requirements can be programmed into the local controller 612, can reside on a memory accessible by the local controller 612, or provided by a user (user power delivery requirements). In an embodiment, the first, second, and third sensors 614, 618, 611 are either V-I sensors (capable of measuring voltage, current, and phase) or directional couplers able to measure phase. In some implementations only one of the two second sensor 618 positions (618*a* or 618*b*) is implemented.

The transmission mediums 608, 610 can be implemented as high power cables (e.g., coaxial cables) or transmission lines. They can also be electrical connections between an adjacent or connected source generator 112 and match network 204. In an embodiment, the source generator 112 is connected to the match network 604 as part of a unified power delivery system 600 such that the transmission medium 608 is merely an internal electrical connection between two subcomponents of the power delivery system 600. In another embodiment, the source generator 112 and the match network 204 are so interconnected that a transmission medium 608 does not exist. In other words, the source generator 112 and match network 604 can be part of a single box, container, package, or unit. Such an embodiment could entail greater integration of sub-components (e.g., power sources, memory, and processors, to name a few) and communications between the source generator 112 and the match network 604. Some sub-components within the source generator 112 and match network 604 can be shared. For instance, the match network 604 can be made such an integral part of the source generator 112 that the source generator 112 and the match network 604 can both share a filter and/or final combiner of the source generator 112.

In an embodiment, a power control system can comprise the local controller 612, the first sensor 614, and optionally the second sensor 618. The power control system can be used to modify existing power delivery systems to enhance their power delivery capabilities as discussed above.

Figure 7:
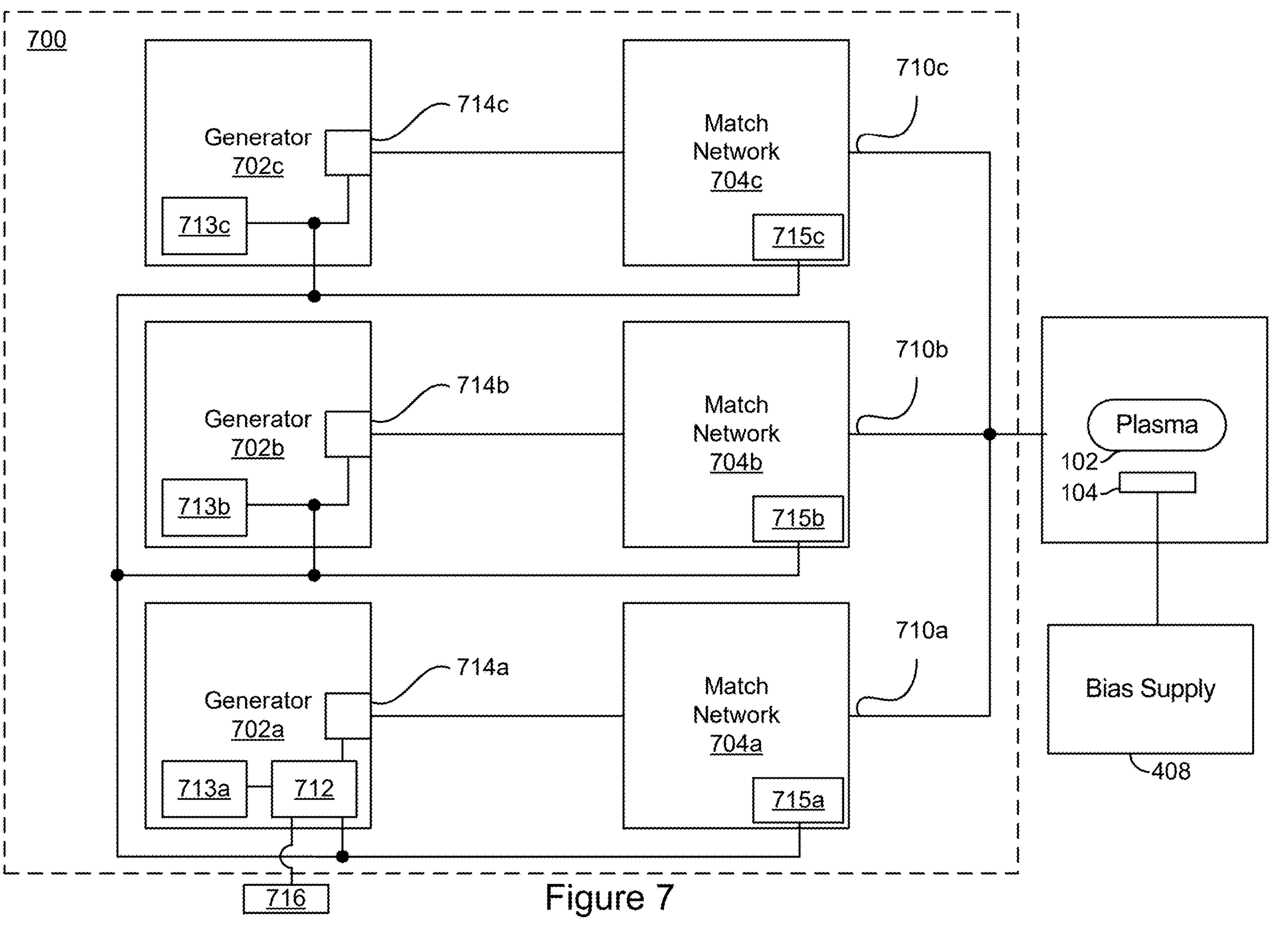
FIG. 7 illustrates an embodiment of a multi-generator power delivery system.

FIG. 7 illustrates an embodiment of a multi-generator power delivery system 700. The power delivery system 700 comprises three generators 702*a*, 702*b*, 702*c* each with a match network 704*a*, 704*b*, 704*c* used to minimize reflected power as the generators 702*a*, 702*b*, 702*c* provide power to a plasma 102. A sensor 714*a*, 714*b*, 714*c* is included for monitoring generator 702*a*, 702*b*, 702*c* voltage, current, phase, impedance, and power. The sensors 714*a*, 714*b*, 714*c* can be part of each generator 702*a*, 702*b*, 702*c* or coupled to each generator 702*a*, 702*b*, 702*c* or external to each generator 702*a*, 702*b*, 702*c*. The sensors 714*a*, 714*b*, 714*c* relay voltage, current, phase, power and impedance measurements to a local controller 712.

The sensors 714*a*, 714*b*, 714*c* can also relay identifications of themselves including information such as configuration and operating parameters to the local controller 712. The generators 702*a*, 702*b*, 702*c* and the match networks 704*a*, 704*b*, 704*c* can also identify themselves to the local controller 712, for instance via the RF engines 713*a*, 713*b*, 713*c* and the impedance control systems 715*a*, 715*b*, 715*c*, respectively.

The local controller 712 can manage communications between the generators 702*a*, 702*b*, 702*c*, the match networks 704*a*, 704*b*, 704*c*, and the sensors 714*a*, 714*b*, 714*c*. The local controller 712 is also configured to pass instructions to the generators 702*a*, 702*b*, 702*c* and the match networks 704*a*, 704*b*, 704*c* regarding how and when to adjust internal parameters. In this way the local controller 712 enables the generators 702*a*, 702*b*, 702*c* and the match networks 704*a*, 704*b*, 704*c* to operate in unison and in a fashion that takes into account variations between components as well as operation of other components. In some instances, this unified operation of the power delivery system 700 can also consider non-electrical factors such as plasma chamber gas chemistry or processing end point. In an embodiment, a frequency of the generators 702*a*, 702*b*, 702*c* can be tuned while also tuning the match networks 704*a*, 704*b*, 704*c*.

In this multi-generator embodiment, a particular challenge in the art is generating consistent power since each generator 702*a*, 702*b*, 702*c* sees the other generators 702*a*, 702*b*, 702*c* through the transmission mediums 710*a*, 710*b*, 710*c* or the plasma 102 (depending on the configuration). In other words, traditional multi-generator systems are plagued by cross talk interaction between the generators 702*a*, 702*b*, 702*c*. By enabling the generators 702*a*, 702*b*, 702*c* and match networks 704*a*, 704*b*, 704*c* to communicate with each other via the local controller 712 and to be controlled with the local controller 712 taking into account the operation of all of these components simultaneously, consistent and accurate power can be provided to the plasma 102.

In an embodiment, a user can interface with an external controller 716, which is in communication with the local controller 712. The external controller 716 can send and receive both instructions and data to and from the local controller 712. User control of the generators 702*a*, 702*b*, 702*c* and match networks 704*a*, 704*b*, 704*c* is made via the local controller 712 by way of the external controller 716.

While the local controller 712 is illustrated as being part of generator 702*a*, it can also be a part of generator 702*b* or generator 702*c*. Alternatively, all other locations within the power delivery system 700 can also be used.

Furthermore, the local controller 712 can communicate with an RF engine 713*a*, 713*b*, 713*c* of each generator 702*a*, 702*b*, 702*c* and an impedance control system 715*a*, 715*b*, 715*c* of each match network 704*a*, 704*b*, 704*c*. In particular, the local controller 712 can communicate with and pass instructions to these subcomponents. In this way, the local controller 712 can instruct the generators 702*a*, 702*b*, 702*c* and match networks 704*a*, 704*b*, 704*c* to alter operating parameters such as pulse frequency and variable capacitor position, to name two non-limiting examples.

Figure 8:
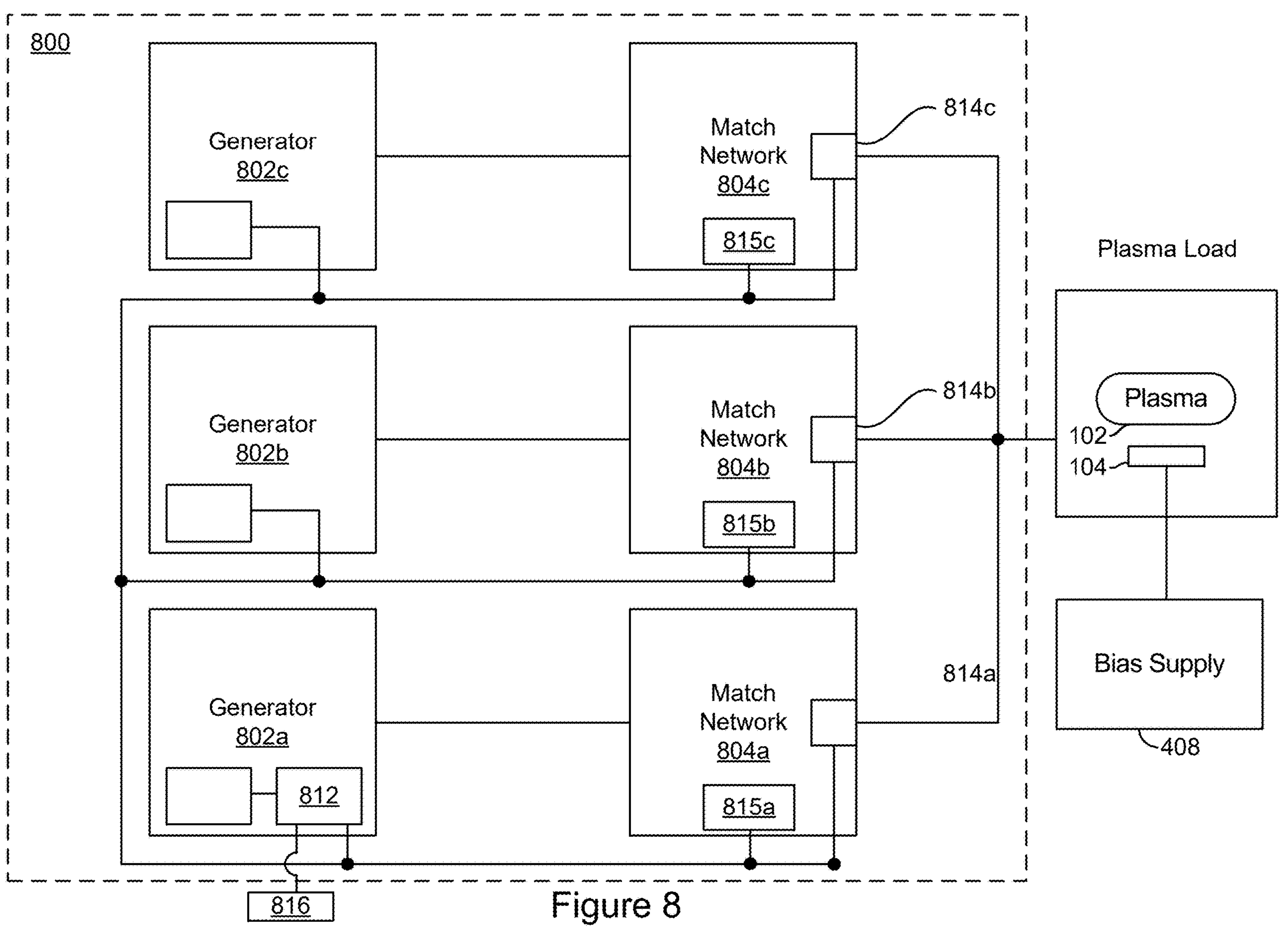
FIG. 8 illustrates another embodiment of a multi-generator power delivery system.

FIG. 8 illustrates another embodiment of a multi-generator power delivery system 400. FIG. 8 differs from FIG. 7 in that the sensors 814*a*, 814*b*, 814*c* are arranged at outputs of the match network 804*a*, 804*b*, 804*c* instead of at outputs of the generators 802*a*, 802*b*, 802*c*. The sensors 814*a*, 814*b*, 814*c* are configured to characterize the power for each generator 802*a*, 802*b*, 802*c* and match network 804*a*, 804*b*, 804*c* by measuring voltage, current, phase, impedance, and/or power at the output of the match networks 804*a*, 804*b*, 804*c* or en route to the plasma 102.

The sensors 814*a*, 814*b*, 814*c* and the generators 802*a*, 802*b*, 802*c* can identify themselves to the local controller 812 via the RF engines and the impedance control systems 815*a*, 815*b*, 815*c*, respectively.

The power delivery system 800 can interface with users via an external controller 816. The external controller 816 can be in communication with the local controller 812 and send and receive both instructions and data to and from the local controller 812.

As in previous embodiments, the local controller 812 can be arranged as part of the generator 802*a*, as illustrated, or as part of any of the other components within the power delivery system 800 or adjacent to any of these components, but still within the power delivery system 800.

While impedance control systems 815*a*, 815*b*, 815*c* are illustrated for each match network 804*a*, 804*b*, 804*c*, one of skill in the art will recognize that these can either represent separate hardware (or software or firmware) components, or a single hardware component comprising a separate logical block for each match network 804*a*, 804*b*, 804*c*. In an alternative embodiment, a single impedance control system (not illustrated) may control operating parameters of all three match networks 804*a*, 804*b*, 804*c*.

In another embodiment, the sensors 814*a*, 814*b*, 814*c* can be replaced by a single sensor located between the match networks 804*a*, 804*b*, 804*c* and the plasma 102. The single sensor can measure voltage, current, phase, impedance, and power just as the three sensors 814*a*, 814*b*, 814*c* illustrated are configured to.

Although the generators 802*a*, 802*b*, 802*c* and the match networks 804*a*, 804*b*, 804*c* are illustrated as communicating with the local controller 812 via the same signal paths (in a bus configuration), in other embodiments, each component may have a separate signal path to the local controller. Alternatively, the generators 802*a*, 802*b*, 802*c* may have one signal path to the local controller 812 while the match networks 804*a*, 804*b*, 804*c* have another signal path to the local controller 812. The sensors 814*a*, 814*b*, 814*c* can also have their own signal path to the local controller 812.

Figure 9:
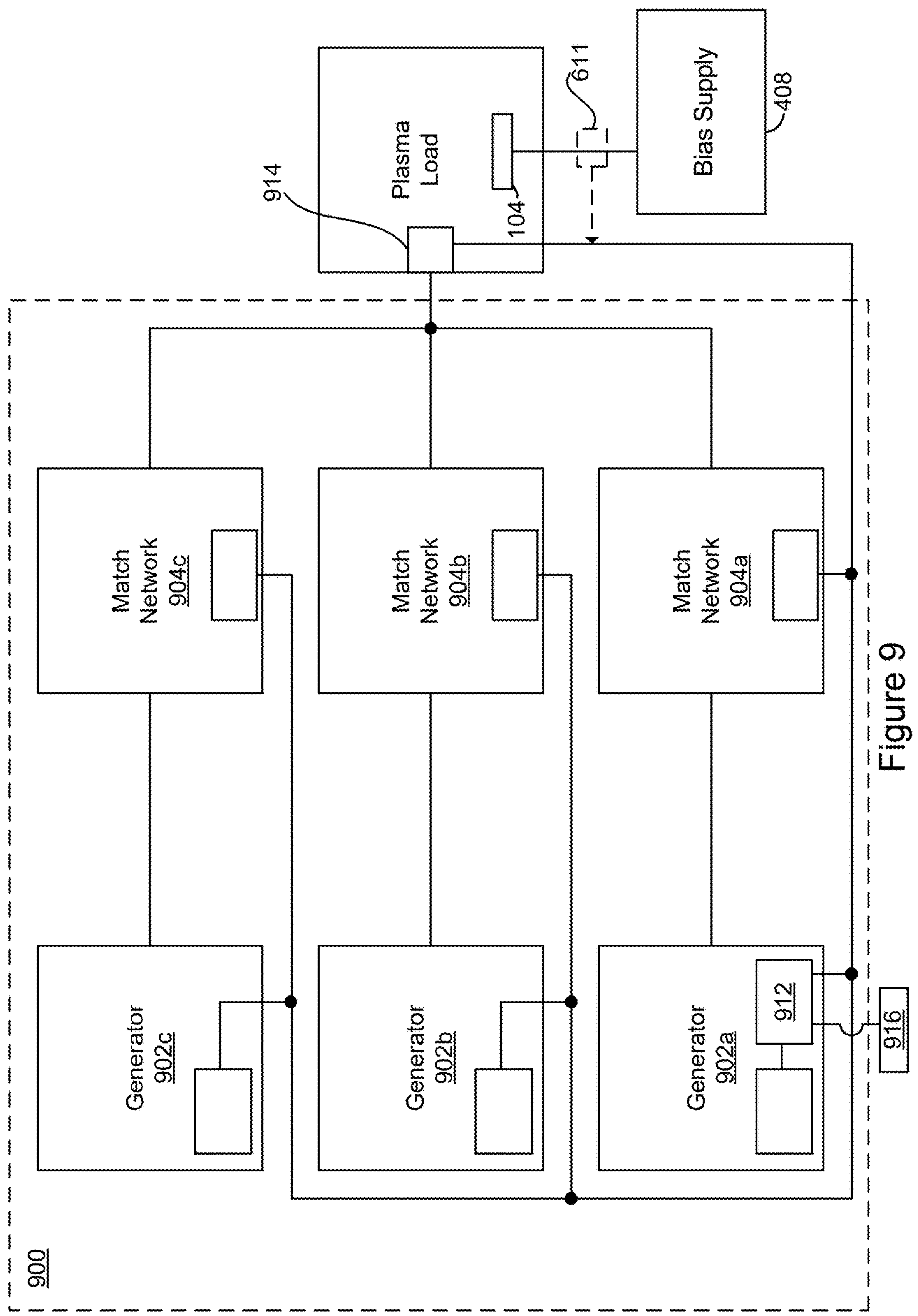
FIG. 9 illustrates yet another embodiment of a multi-generator power delivery system.

FIG. 9 illustrates yet another embodiment of a multi-generator power delivery system 500. FIG. 9 differs from FIGS. 7 and 8 in that the sensors of those figures are replaced here by a single sensor 914 arranged at an input of the plasma 102. The sensor 914 is configured to characterize the power for each generator 902*a*, 902*b*, 902*c* and match network 904*a*, 904*b*, 904*c*.

The power delivery system 900 can interface with users via an external controller 916. The external controller 916 can be in communication with the local controller 912 and send and receive both instructions and data to and from the local controller 912.

Although the generators 902*a*, 902*b*, 902*c* and the match networks 904*a*, 904*b*, 904*c* are illustrated as communicating with the local controller 912 via the same signal paths (in a bus configuration), in other embodiments, each component may have a separate signal path to the local controller. Alternatively, the generators 902*a*, 902*b*, 902*c* may have one signal path to the local controller 912 while the match networks 904*a*, 904*b*, 904*c* have another signal path to the local controller 912.

While each external controller of FIGS. 7-9 is illustrated as having its own signal path to the local controller, in alternative embodiments, each external controller can share the same signal path used by the sensor generators, and match networks use to communicate with the local controller.

Although the multi-generator embodiments illustrated in FIGS. 7-9 show three sets of generators, match networks, and sensors, in other embodiments, these configurations can be implemented with two or more sets of generators, match networks, and sensors. In one embodiment, there can be a single sensor rather than a sensor for each set of generators and match networks. The single sensor could measure power output locally for one generator and remotely for two generators. The single sensor could also remotely characterize impedance for all three match networks.

Figure 10:
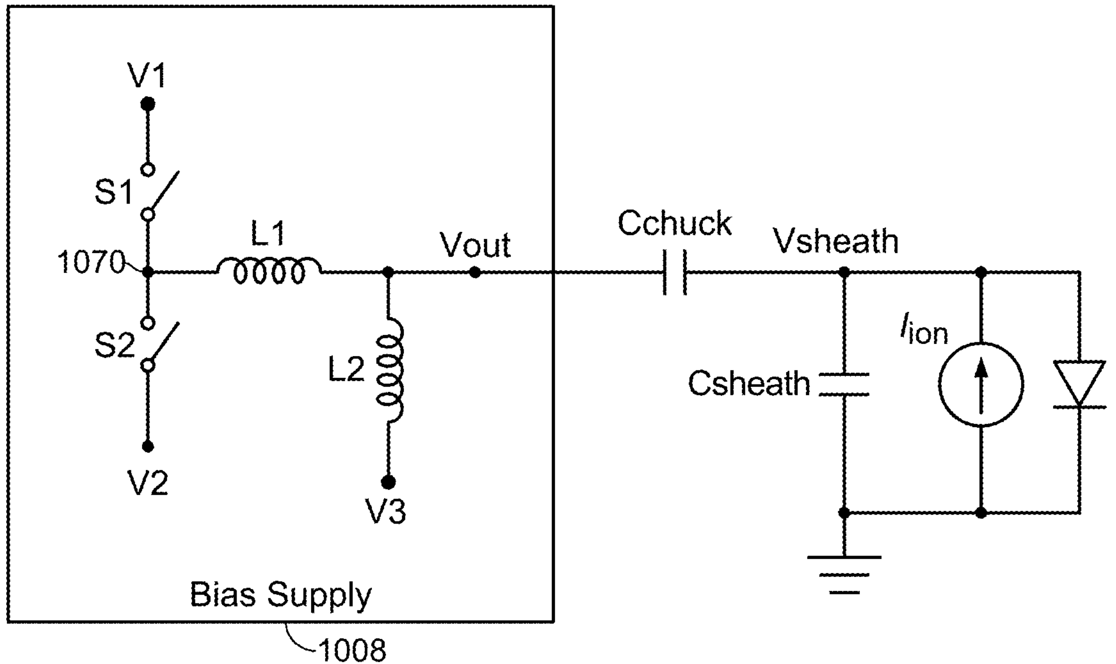
FIG. 10 is a diagram depicting aspects of an exemplary bias supply.

Referring next to FIG. 10, shown is a general representation of an exemplary bias supply 1008 that may be used to realize the bias supplies 408, 508. As shown, the bias supply 1008 utilizes three voltages V1, V2, and V3. Because the output, Vout, is capacitively coupled through Cchuck, it is generally not necessary to control the DC level of Vout and the three voltages can be reduced to two by choosing one of V1, V2 or V3 to be ground (0V). A separate chucking supply 107 may be used so it is not necessary to control the DC level of Vout. If a separate chucking supply is not used, all three voltages can be controlled to control the DC level of Vout. Although not shown for clarity, the two switches S1, and S2 may be controlled by a switch controller via electrical or optical connection to enable the switch controller to open and close the switches, S1, S2, as disclosed below. The depicted switches S1, S2 may be realized by single pole, single throw switches, and as a non-limiting example, the switches S1, S2 may be realized by silicon carbide metal-oxide semiconductor field-effect transistors (SiC MOSFETs).

In this implementation, the voltages V1, V2, and V3 may be DC-sourced voltages. As shown, the first switch, S1, is disposed to switchably connect the first voltage, V1, to the output, Vout, through and inductive element and the second switch, S2, is disposed to switchably couple the second voltage, V2, to the output, Vout, through an inductive element. In this implementation the two switches connect to a common node, 1070, and a common inductive element, L1, is disposed between the common node and an output node, Vout. Other arrangements of the inductive elements are possible. For example, there may be two separate inductive elements with one inductive element connecting S1 to Vout and another connecting S2 to Vout. In another example one inductive element may connect S1 to S2 and another inductive element may connect either S1 or S2 to Vout.

Figure 11:
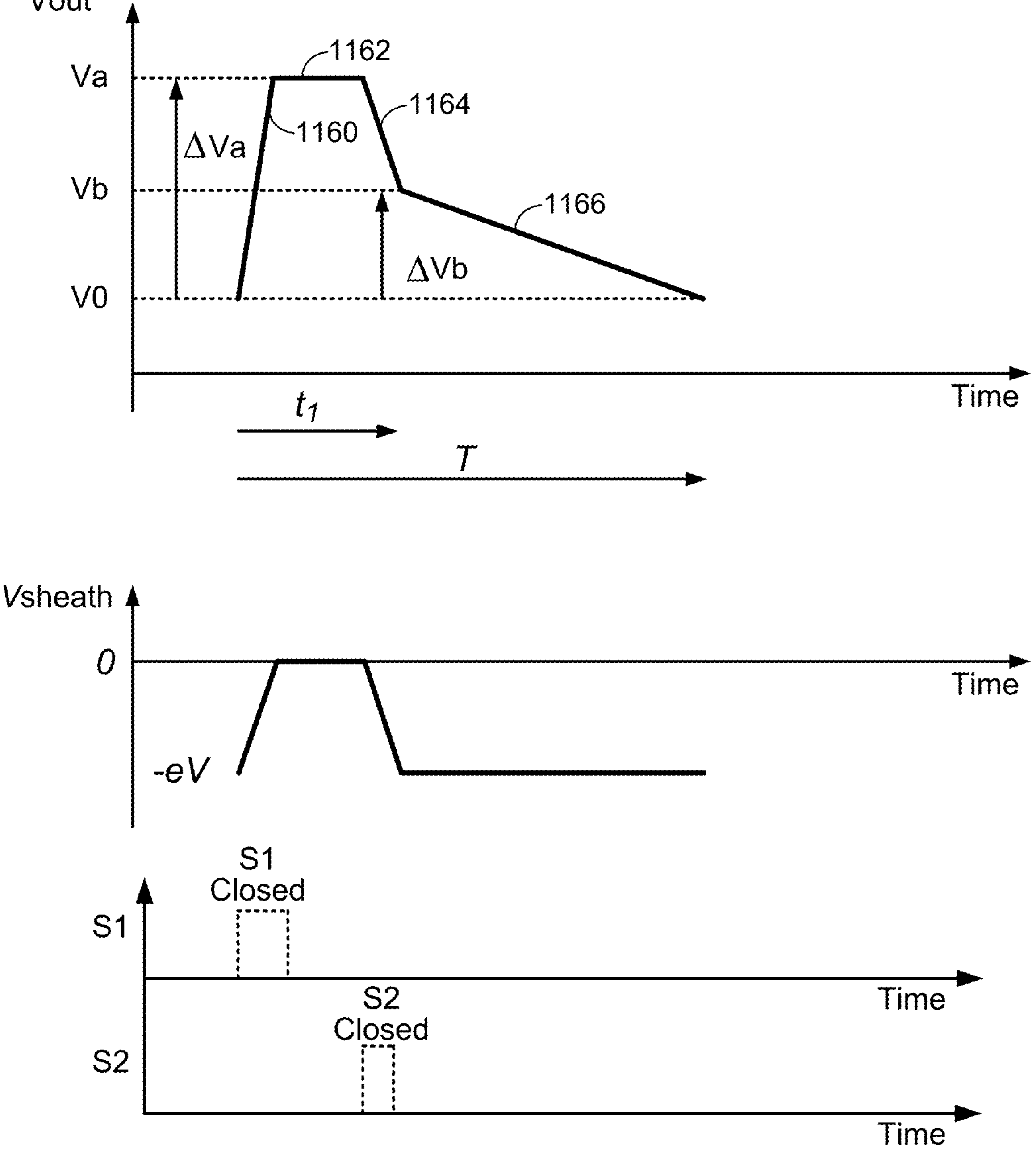
FIG. 11 comprises a graph of a voltage waveform output from a bias supply; a graph of a corresponding sheath voltage; and a corresponding switch-timing diagram.

While referring to FIG. 10, simultaneous reference is made to FIG. 11, which depicts: 1) the voltage waveform of the bias supply 1008 that is output at Vout; 2) a corresponding sheath voltage; and 3) corresponding switch positions of switches S1 and S2. In operation, the first switch, S1, is closed momentarily to increase, along a first portion 1160 of the voltage waveform (between voltage V0 and Va) a level of the voltage at the output node, Vout, to a first voltage level, Va. The level Va is maintained along a second portion 1162 of the waveform. The second switch, S2, is then closed momentarily to decrease, along a third portion 1164 of the waveform, the level of the voltage waveform at the output node, Vout, to a second voltage level, Vb. Note that S1 and S2 are open except for short periods of time. As shown, the negative voltage swing along the third portion 1164 affects the sheath voltage (Vsheath); thus, a magnitude of Va-Vb may be controlled to affect the sheath voltage.

In this embodiment the third voltage, V3, is applied to the output node, Vout, through a second inductive element L2 to further decrease a level of the voltage at the output node along a fourth portion 1166 of the voltage waveform. As shown in FIG. 11, the negative voltage ramp along the fourth portion 1166 may be established to maintain the sheath voltage by compensating for ions that impact the substrate.

Thus, S1 momentarily connects and then disconnects the first voltage, V1, to the output, Vout, through the first inductive element L1, and after a period of time, S2 connects and then disconnects the second voltage (e.g., ground) to the output, Vout, through the first inductive element L1. The third voltage, V3, is coupled to the output, Vout, through a second inductive element L2. In this implementation, the first voltage, V1, may be higher than the third voltage V3, and the momentary connection and disconnection of the first voltage, V1, to the output Vout causes the voltage of the output, Vout, to increase along the first portion 1160 of the voltage waveform to a first voltage level, Va, and the first voltage level, Va, is sustained along the second portion of the waveform 1162. The first voltage level Va may be above the first voltage, V1, and the second voltage, V2, (e.g., ground) may be less than the first voltage level, Va. The momentary connecting and then disconnecting of the second voltage, V2, causes the voltage of the output, Vout, to decrease at the third portion 1164 to the second voltage level Vb that is below the second voltage, V2 (e.g., ground).

As an example, V1 may be −2000 VDC; V2 may be ground; V3 may be −5000 VDC; V0 may be −7000 VDC; Vb may be −3000 VDC; and Va may be 3000 VDC. But these voltages are merely exemplary to provide context to relative magnitude and polarities of the voltages described with reference to FIGS. 10 and 11.

Figure 12A:
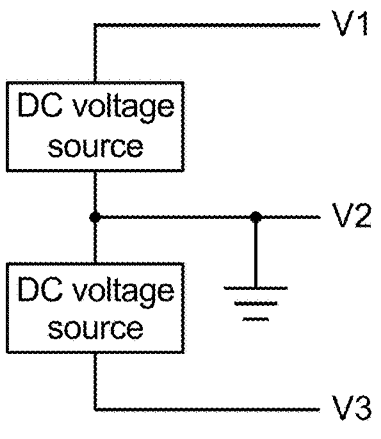
FIG. 12A depicts an implementation using two voltage sources to provide voltages to the bias supply depicted in FIG. 10.
Figure 12B:
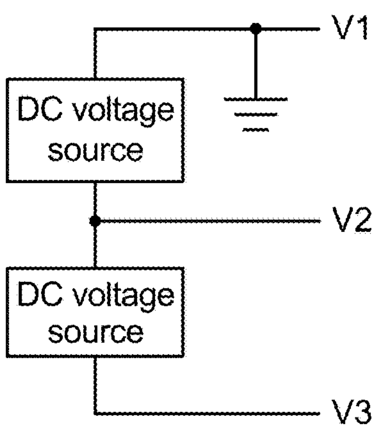
FIG. 12B depicts another implementation using two voltage sources to provide voltages to the bias supply depicted in FIG. 10.
Figure 12C:
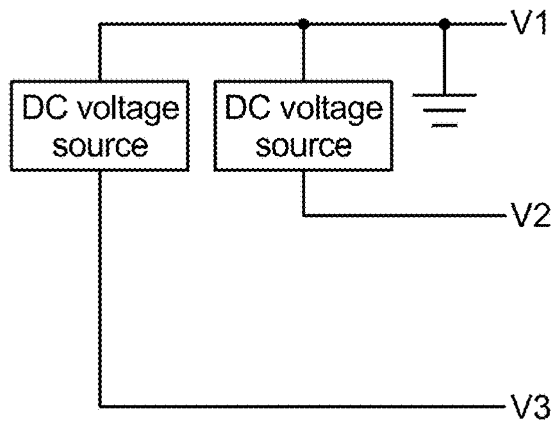
FIG. 12C depicts yet another implementation using two voltage sources to provide voltages to the bias supply depicted in FIG. 10.

Referring next to FIGS. 12A-12C shown are possible arrangements of two DC voltage sources to provide the voltages V1, V2, and V3 depicted in FIG. 10. In FIG. 12A, V2 is grounded and forms a common node between the two DC voltage sources. In FIG. 12B, V1 is grounded and V2 forms a common node between the DC voltage sources. And in FIG. 12C, V1 is grounded and forms a common node between each of the two DC voltage sources.

Figure 13A:
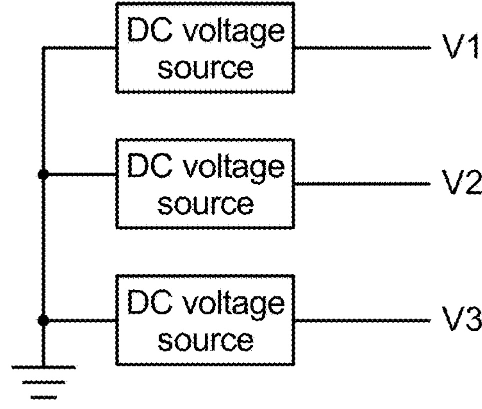
FIG. 13A depicts an implementation using three voltage sources to provide voltages to the bias supply depicted in FIG. 10.
Figure 13B:
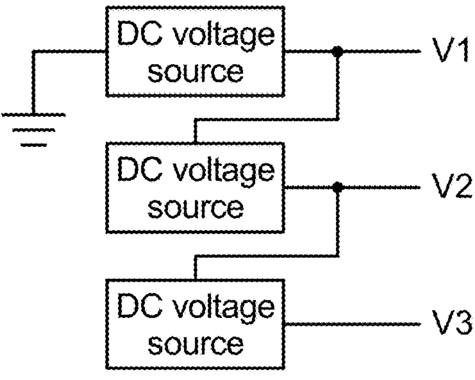
FIG. 13B depicts another implementation using three voltage sources to provide voltages to the bias supply depicted in FIG. 10.
Figure 13C:
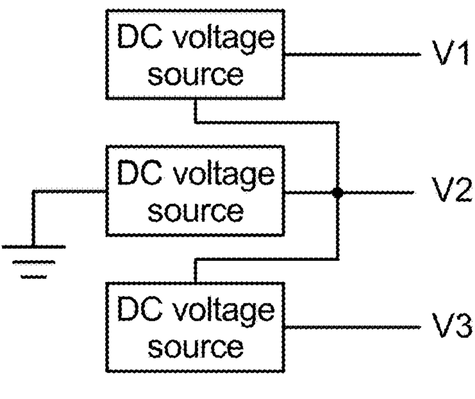
FIG. 13C depicts yet another implementation using three voltage sources to provide voltages to the bias supply depicted in FIG. 10.

In some embodiments, as shown in FIGS. 13A, 13B, and 13C, three DC voltage sources may be utilized to apply the three voltages V1, V2, and V3. As shown in FIG. 13A, each of the three DC voltage sources may be coupled to ground, and each of the three DC voltage sources provides a corresponding one of V1, V2, V3. In FIG. 13B one of the DC voltages sources is grounded and the three DC voltage sources are arranged in series. In FIG. 13C, one of DC voltages sources is disposed between ground and V2, and each of the DC voltage sources is coupled to V2.

The bias supply 1008 depicted in FIG. 10 is merely an example of a bias supply 1008 that may produce an output at Vout as shown in FIG. 11. Other variations are shown and described the incorporated-by-reference patents referred to earlier herein. Also disclosed in the incorporated-by-reference patents are different modulation schemes that may be applied to the basic source waveform (at Vout) to achieve a desired distribution of ion energies and to control average power applied to the plasma chamber by the bias supply.

One modulation scheme comprises modulating the third portion 1164 of the voltage waveform to effectuate desired ion energies of ions impinging upon the workpiece 103 in the plasma chamber 101. As an example, the bias supply 408, 508, 1008 may alternate a magnitude of the third portion 1164 of the voltage waveform between two or more levels to effectuate an alternating surface potential of the workpiece 103 in the plasma between two or more distinct levels. As another example, a slope of the fourth portion 1166 of the voltage waveform may be adjusted to change a level of current that is provided to an electrode 104 (to compensate for ion current that impinges upon the workpiece 103) to achieve a desired spread of ion energies (e.g., around a center ion energy). Successful use of bias supplies 408, 508, 1008 as a bias generator in many plasma processing systems requires careful system design.

System Synchronization and Communication

Modulating supplies such as the source generators 112, bias generators 108, remote plasma sources 205, and bias supplies 408, 508, 1008 can cause strong modulation of plasma properties. Examples of plasma properties, without limitation, comprise an impedance presented by the plasma, plasma density, sheath capacitance, and a surface potential of the workpiece 103 in the plasma 102. As discussed above, the modulation of the voltage and/or current applied by the bias supplies 408, 508, 1008 is one potential cause of modulating plasma properties.

Source generators 112 may also modulate plasma properties by modulating electromagnetic fields impacting the plasma 102. In particular, source generators 112 may pulse the power (e.g., RF power) that is applied by a source generator 112. Moreover, a magnitude of voltage of the power applied by a source generator 112 may be changed. The addition of one or more additional source generators 112 adds additional complexity. And it is also contemplated that one or more bias supplies 408, 508, 1008 may modulate the voltage (Vout shown in FIG. 10), and hence sheath voltage, while a source generator 112 is applying pulsed power. Thus, control over plasma properties (e.g., plasma density and ion energy) is challenging, and spatial control over the plasma properties is especially challenging.

As discussed above, a remote plasma source 205 may replace, or augment, a source generator 112. But remote plasma sources 205 may also be modulating supplies that are configured to modulate plasma properties by modulating properties of gases in the plasma chamber 101.

In addition to control challenges, one modulating supply may affect (e.g., in an adverse manner) operation of another modulating supply. As a specific, non-limiting, example, the bias supplies 408, 508, 1008 may impart power at a level that results in plasma modulation, which in turn, cause undesirable changes in the load impedance presented to a source generator 112. In addition, strong plasma modulation can also cause aliasing of measurements of plasma properties. The aliasing may prevent accurate measurements of forward and reflected power; thus, preventing an operator from detecting damaging power levels and/or prevent proper control over at least one of the source matching network 113 or the bias matching network 110.

Synchronization of equipment connected to the plasma system may mitigate the adverse effects of plasma modulation (e.g., damaging power and aliasing), and as a consequence, synchronization is highly desired. But the complex, time varying, aspects of plasma modulation (e.g., resulting from potentially many modulating supplies) can make synchronization difficult.

Figure 14:
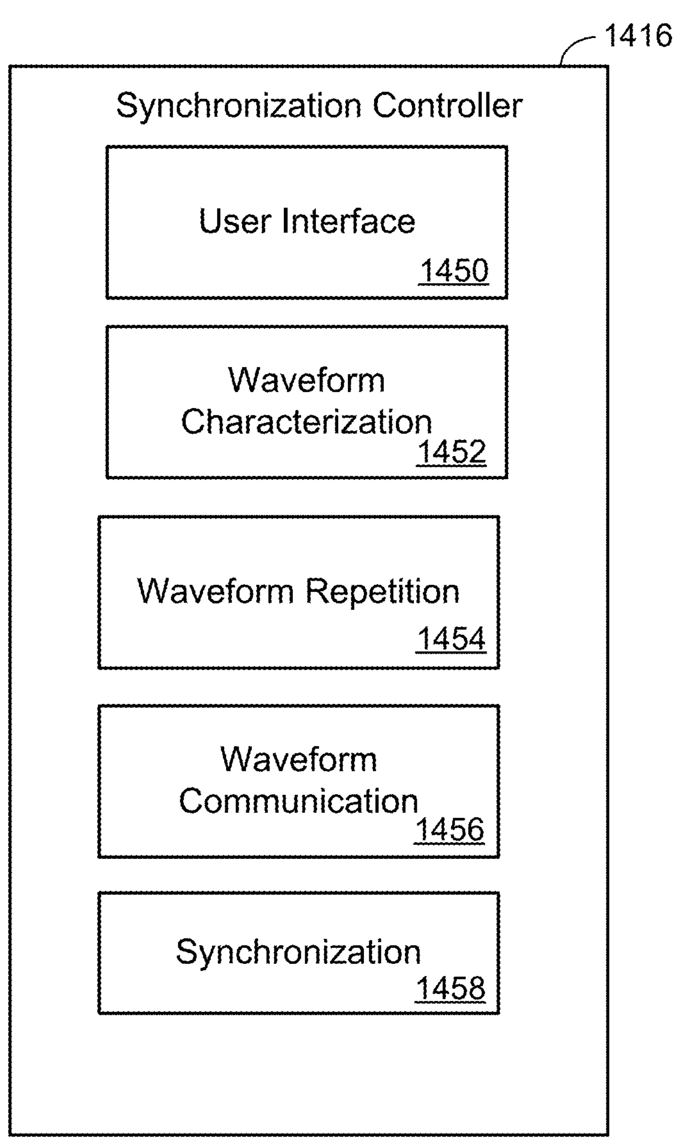
FIG. 14 is a block diagram depicting a synchronization control component.

Referring to FIG. 14, shown is a synchronization controller 1416 that is configured to synchronize constituent equipment of a plasma processing system that may comprise modulating supplies and other equipment that does not modulate the plasma 102. As shown, the synchronization controller 1416 comprises a user interface 1450, a waveform-characterization module 1452, a waveform-repetition module 1454, a waveform-communication module 1456, and a synchronization module 1458.

The depicted components of the synchronization controller 1416 may be realized by hardware, firmware, software and hardware or combinations thereof. The functional components of the synchronization controller 1416 may be distributed about the plasma processing system and duplicated in equipment that is connected to the plasma processing system. And as discussed further herein, the synchronization controller 1416 may be implemented as a master device or slave device.

The user interface 1450 enables an operator to interact with the plasma processing system so that the operator may control aspects of the synchronization and the operator may receive information about conditions of the equipment and the plasma chamber 101. The user interface 1450 may be realized, for example, by one or more of a touch screen, pointing device (e.g., mouse), display, and keyboard.

The waveform-characterization module 1452 is generally configured to generate a waveform dataset that characterizes a waveform (e.g., a waveform of a modulation of the plasma or a waveform output (or desired to be output) by equipment) of the plasma processing system. The waveform-repetition module 1454 is configured to determine a repetition period, T, for a piece of equipment connected to the plasma system, and the waveform-communication module 1456 is configured to communicate the waveform dataset to at least one of the piece of equipment or another piece of equipment connected to the plasma processing system. The synchronization module 1458 is configured to send a synchronization pulse with a synchronization-pulse-repetition-period (which is an integer multiple of T) to one or more pieces of equipment connected to the plasma system.

Figure 15:
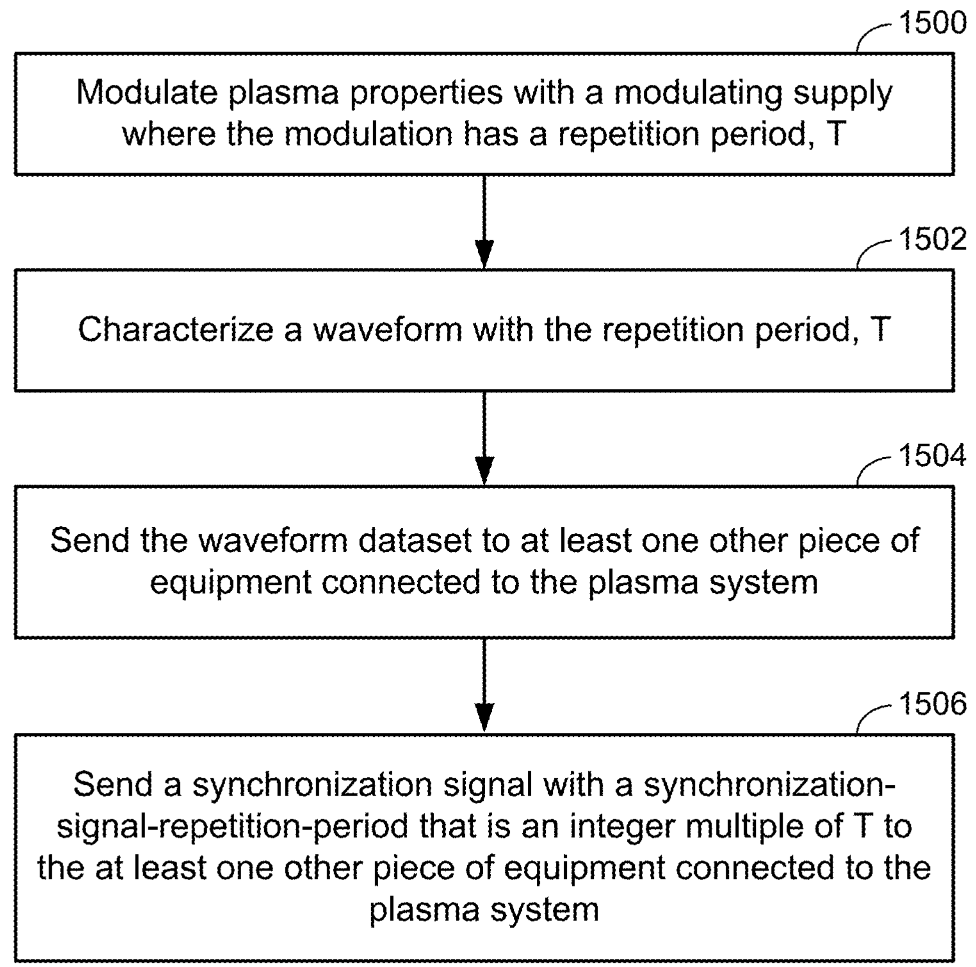
FIG. 15 is a method that may be traversed using the synchronization control component.

While referring to FIG. 14, simultaneous reference is made to FIG. 15, which is a flowchart depicting a method that may be traversed in connection with a plasma processing system and the synchronization controller 1416. As shown, plasma properties are modulated with a modulating supply where the modulation has a repetition period, T (Block 1500). It should be recognized that in many embodiments T is the repetition period of the plasma modulation—not a cycle period of the modulating supply. As a consequence, the modulating supply may have an output with a repetition period that is different than the modulation of the plasma properties. For example, the modulating supply may have a repetition period of 200 microseconds and another modulating supply may have a repetition period of 500 microseconds resulting in the plasma 102 being modulated with a 1 millisecond repetition period, T. In some embodiments, T is a shortest length of time for which waveforms of all pieces of equipment that modulate the plasma properties of the plasma processing system is periodic with period, T.

As shown in FIG. 15, the waveform characterization module 1452 may characterize a waveform with a repetition period, T, containing at least one of information about the modulation of the plasma or a desired waveform of a piece of equipment connected to the plasma processing system to produce a waveform dataset (Block 1502).

Figure 16:
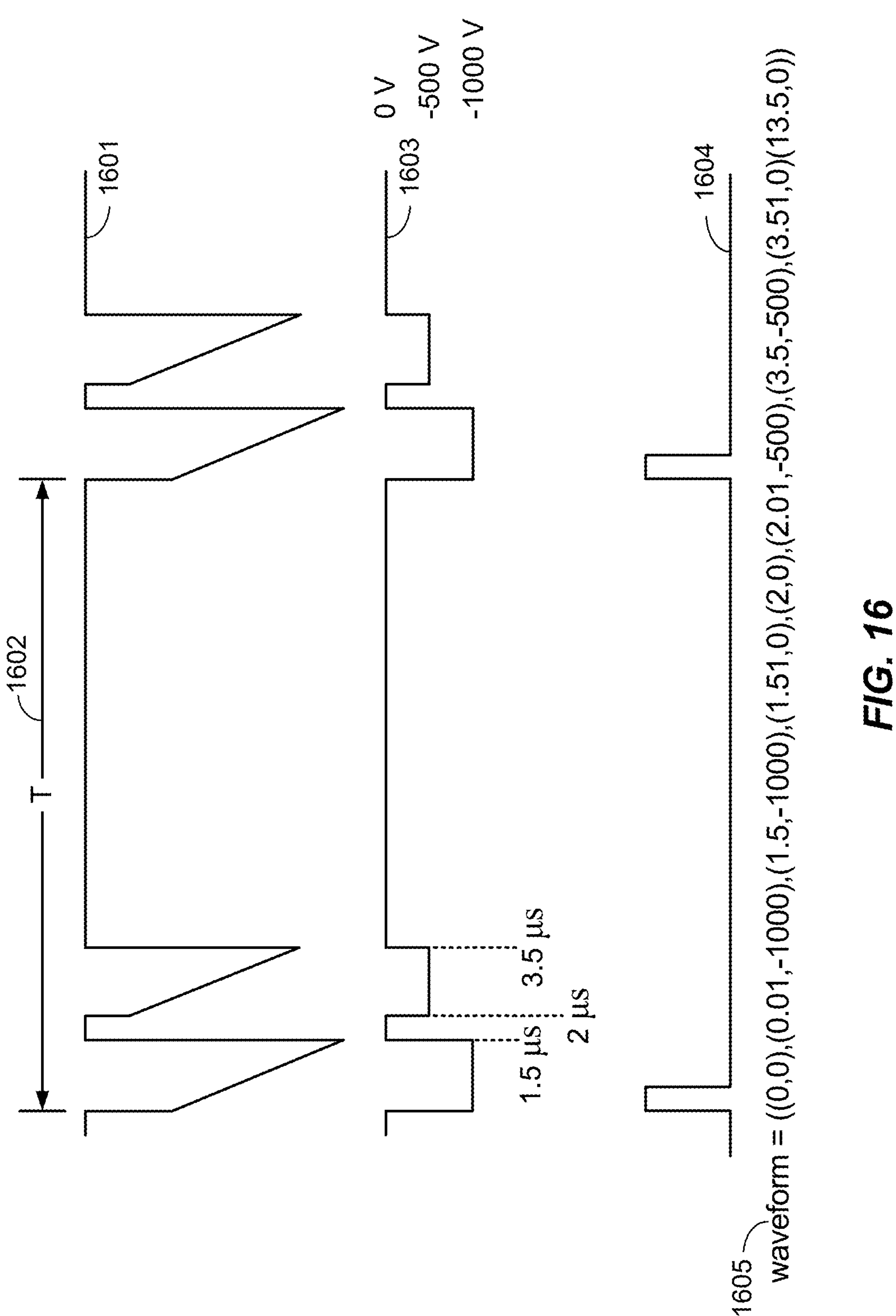
FIG. 16 depicts aspects of synchronizing a modulating supply with other equipment connected to plasma processing system.

Referring briefly to FIG. 16, shown are: an exemplary output waveform 1601 of the bias supply 408, 508, 1008; a waveform 1603 corresponding to is a calculated effective voltage at the surface of the workpiece 103; a corresponding synchronization signal 1604; and information about the waveform in the form of a waveform dataset 1605. In FIG. 16, an output waveform 1601 is the actual output of the bias supply bias supply 408, 508, 1008 (at Vout) with a fundamental period, T, 1602. The waveform 1603 is a calculated effective voltage at the surface of the workpiece 103 (e.g., a sheath voltage that is the voltage of the workpiece 103 relative to the plasma 102). Also shown is a synchronization pulse 1604 (also referred to as a synchronization signal 1604) with a synchronization-signal-repetition-period that is an integer multiple of T. And the waveform dataset 1605 that comprises information about the waveform 1603; thus, a characterized waveform (represented in FIG. 16) is the waveform 1603. It should be recognized that the waveform 1603 represents an alternating surface potential of the workpiece between two or more distinct levels (e.g., −500V and −1000V), but this is only an example and is not required. Alternatively, the characterized waveform may be an output waveform generated by a modulating supply, which in FIG. 16 is the output waveform 1601 of the bias supply 408, 508, 1008. In yet another implementation, the characteristics of the waveform with a repetition period T comprise characteristics of the plasma properties such as plasma density, sheath capacitance, sheath potential, etc.

Referring again to FIG. 15, the waveform dataset 1605 is sent by the waveform-communication module 1456 to the at least one piece of equipment connected to the plasma system (Block 1504), and the synchronization module 1458 sends the synchronization signal 1604 with a synchronization-signal-repetition-period (which is an integer multiple of T) to at least one piece of equipment connected to the plasma system (Block 1506). This method enables synchronization of pieces of equipment connected to the plasma processing system where the characterized waveform contains at least one of information about the modulation of the plasma or information about a desired waveform of a piece of equipment connected to the plasma processing system. It should be recognized that the waveform dataset may be communicated to a receiving-piece of equipment to control the receiving-piece of equipment (e.g., by directing the receiving-piece of equipment to provide a desired waveform). Or the waveform dataset may be informational (e.g., to provide information about the modulation of the plasma or to provide information about an output of a modulating supply).

Although FIG. 16 depicts a specific example of a modulating supply that applies power with a waveform that enables control over ion energy in a region proximate to an electrode 104, the waveform characterization (Block 1506) is generally applicable to other waveforms that may represent aspects of plasma-related modulation (e.g., plasma density, plasma impedance, ion flux, etc.) or aspects of power applied by other equipment. For example, equipment coupled to the plasma processing system may comprise RF and DC generators, and in some implementations, the generator(s) are able to absorb power from the plasma processing system. It is also contemplated that in some embodiments one or more generators are a load that can only absorb power from the plasma processing system. Generators that are able to absorb power are useful for controlling spatial properties of an electromagnetic field in a plasma chamber by, e.g., avoiding standing waves in the chamber.

One or more of the source generators 112 may synchronize a property of the output of the source generator(s) 112 with the characterized waveform (that has the repetition period T). The property of the output of the source generator(s) 112 may be at least one of voltage, current, power, frequency, or generator source impedance. And the output of the source generator(s) 112, for example, may comprise (within one repetition period) pulsed power followed by continuous wave power. And the waveform dataset may comprise a time series of values indicating one or more aspects of power (e.g., voltage, current, phase, etc.) for the repetition period. The source generator 112 may synchronize pulsing with a particular waveform applied by the bias supply 408, 508, 1008 that may, for example, modulate a magnitude of the negative voltage swing (the third portion 1164) in a different manner while the source generator 112 is pulsing as compared to when the source generator 112 is operating in a continuous-wave mode of operation. This use case is only an example, and various other types of processing steps may prompt synchronization among pieces of plasma processing equipment.

In addition, the source generator 112 may advance or delay changes in a property of the output of the source generator 112 with respect to changes in the characterized waveform with a repetition period T. As discussed above, the characterized waveform in some implementations may characterize the modulation of the plasma properties. The characterized waveform may also characterize a waveform of the source generator 112 or another modulating supply (depending upon how the source generator 112 is configured to operate).

The equipment coupled to the plasma processing system (and synchronized as disclosed herein) is certainly not limited to modulating supplies. For example, the at least one piece of equipment that the dataset is sent to (Block 1504) may comprise equipment that is configured to measure properties of the plasma processing system. For example, the measurements may comprise at least one of a measurement of plasma properties, properties of power delivered to the plasma system, or properties of gas delivered to the plasma system. By way of further example, the equipment that is configured to measure properties may comprise one or more of the source measurement and diagnostics system 114 and the bias measurement and diagnostics system 111. Those of ordinary skill in the art recognize that the source measurement and diagnostics system 114 and the bias measurement and diagnostics system 111 may comprise one or more sensors (e.g., directional couplers and/or VI sensors) in connection with hardware to sample and analyze properties of power delivered to the plasma system (which may be used to measure plasma impedance as a plasma property). In the context of a plasma processing system utilizing the remote plasma source 205, properties of the gas delivered to the plasma processing system may be measured (e.g., utilizing optical or other measurement techniques). As discussed herein, plasma modulation can cause aliasing of measurements of plasma properties, so synchronizing measurements to within time windows to avoid misleading transient values (or during time windows where modulation is at a local minima) is beneficial.

Other equipment that may be synchronized comprises matching networks. For example, the impedance matching network may synchronize measurements indicative of impedance with the characterized waveform. By synchronizing the measurements with time windows where measurements are not misleading (e.g., when there not large changes in power levels applied to the plasma), matching may be improved. Examples of impedance matching networks comprise the source matching network 113 and the bias matching network 110.

The waveform dataset 1605 may be sent (Block 1504) via digital communication link to one or more of the pieces of equipment coupled to the plasma processing system. The communication link may comprise the system control bus 117, which may be realized by known digital links (for example, without limitation, ethernet). In many implementations, the waveform dataset 1605 may be communicated once, and then the synchronization pulse prompts each piece of equipment to operate in response to the waveform dataset in a repeating manner.

The synchronization signal may be sent (Block 1506) via the near-real-time communication link 119 to equipment coupled to the plasma processing system. As an example, the near-real-time link may be an analog communication link to provide a single analog output with an identifiable fundamental pulse (also referred to as a "tick")), and if required, update pulses (also referred to as "update-ticks") are sent in between the fundamental pulses. In addition, the synchronization signal may comprise an indication of a start of the synchronization signal repetition period as well as at least one indication that a period of time since the start of the synchronization signal repetition period has elapsed.

The start of the synchronization signal repetition period may be indicated by a pulse of a first duration and the indication that a period of time since the start of the synchronization signal repetition period has elapsed may be indicated by a pulse of a second duration that is different from the first duration. For example, the first duration may be longer than the second duration or vice versa.

In some implementations, the synchronization signal comprises an indication of the start of the synchronization signal repetition period where the start of the synchronization signal repetition period is further modified at least once to indicate a time of day or to indicate that a new waveform is taking effect.

Figure 17:
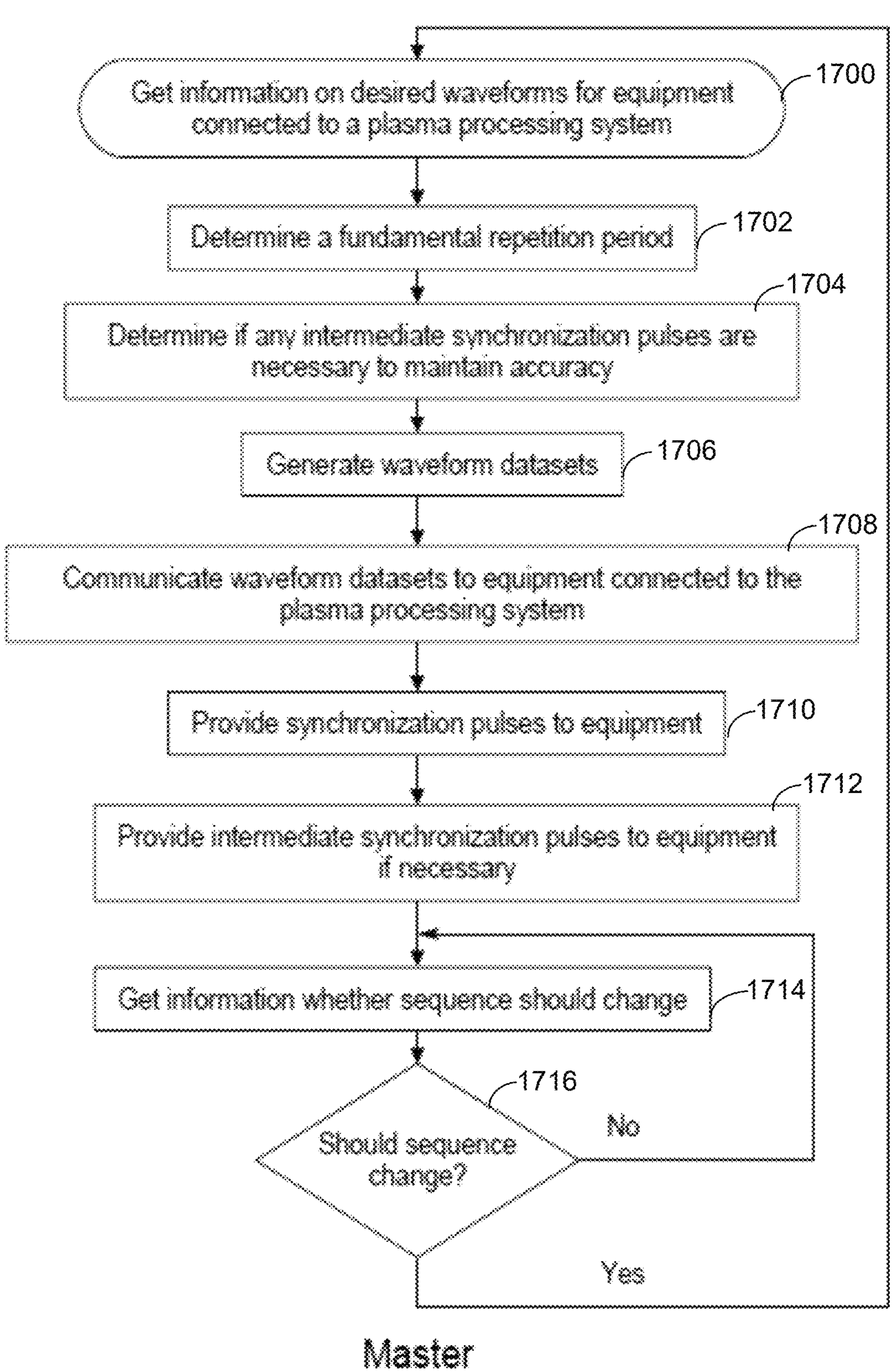
FIG. 17 is a flowchart depicting an exemplary method that may be executed from a master device.
Figure 18:
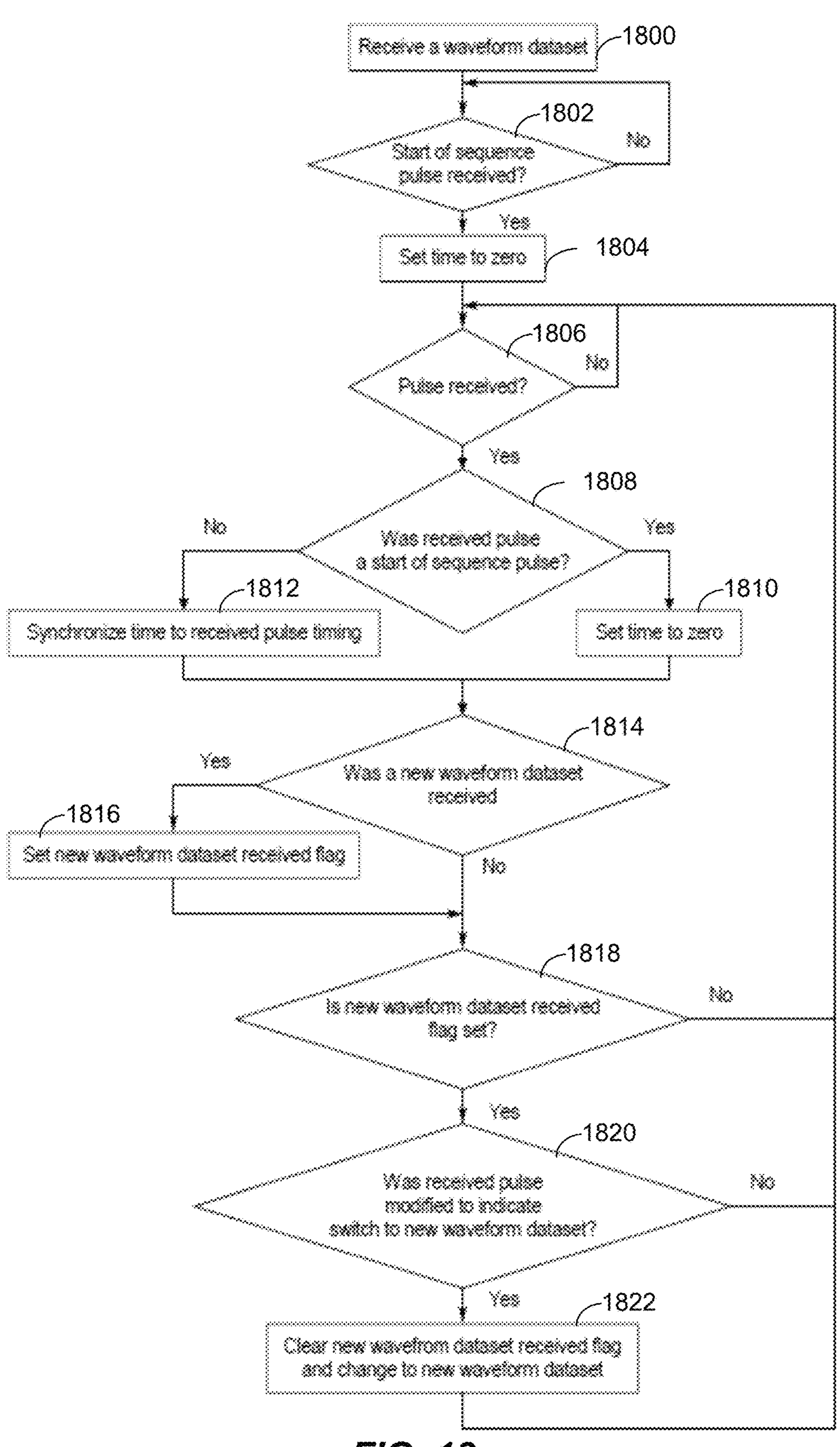
FIG. 18 is a flowchart depicting an exemplary method that may be executed by a slave device.

Referring to FIGS. 17 and 18 shown are flowcharts depicting activities carried out at a master piece of equipment and activities carried out at a slave piece of equipment, respectively. As shown in FIG. 17, at a master piece of equipment, information on desired waveforms for equipment connected to the plasma processing equipment is obtained (Block 1700), and a fundamental repetition period is determined (Block 1702). A determination is also made to establish whether any intermediate synchronization pulses are necessary to maintain accuracy (Block 1704). Waveform datasets are generated (Block 1706) and then communicated to equipment connected to the plasma processing system (Block 1708). In addition, synchronization pulses are provided to equipment connected to the plasma processing system (Block 1710). As shown, intermediate synchronization pulses are provided to equipment if necessary (Block 1712). And information about whether a sequence should change is also obtained (Block 1714), and if the sequence should change (Block 1716), then the activities described above with reference to Blocks 1700 to 1714 are performed again.

As shown in FIG. 18, at a slave piece of equipment, a waveform dataset is received (Block 1800), and the slave then waits for a start-of-sequence pulse to be received (Block 1802) before setting a time to zero (Block 1804). The slave equipment then waits for a pulse to be received (Block 1806) and determines whether or not the pulse was a start-of-sequence pulse (Block 1808), and if so, a time is set to zero (Block 1810). If the received pulse is not a start-of-sequence pulse (Block 1808), then the time is synchronized to a timing of the received pulse (Block 1812). As shown, if a new waveform dataset is received (Block 1814), then a new-waveform-dataset-received-flag is set (Block 1816). If the new-waveform-dataset-received-flag is set (Block 1818) and the received pulse is modified to indicate a change to a new dataset (Block 1820), then the new-waveform-dataset-received-flag is cleared and the new waveform dataset is utilized (Block 1822).

By utilizing precision oscillators, synchronization can be maintained with good precision. For example, using 50 ppm oscillators in all equipment, a change in a waveform can be predicted with better than 50 ns accuracy for a fundamental pulse repetition rate as low as 10 kHz. For longer pulse repetition periods one can add additional synchronization pulses every 100 μs to maintain synchronization within 50 ns accuracy.

Synchronization between a source generator 112 and bias supply 408, 508, 1008 may entail lowering voltage or cutting off voltage at the end of a given bias supply pulse. For example, it may be desirable to avoid ending an RF pulse in the midst of a bias supply pulse. Alternatively, pulsing or periodic reductions in voltage, may start and end at the same point/phase in the bias supply pulse, but for different pulses. In other words, it may be desirable to set the pulse on length equal to an integer number of bias supply pulses, whether or not the envelope pulse is in phase with a start or end to an individual bias supply pulse.

Figure 19:
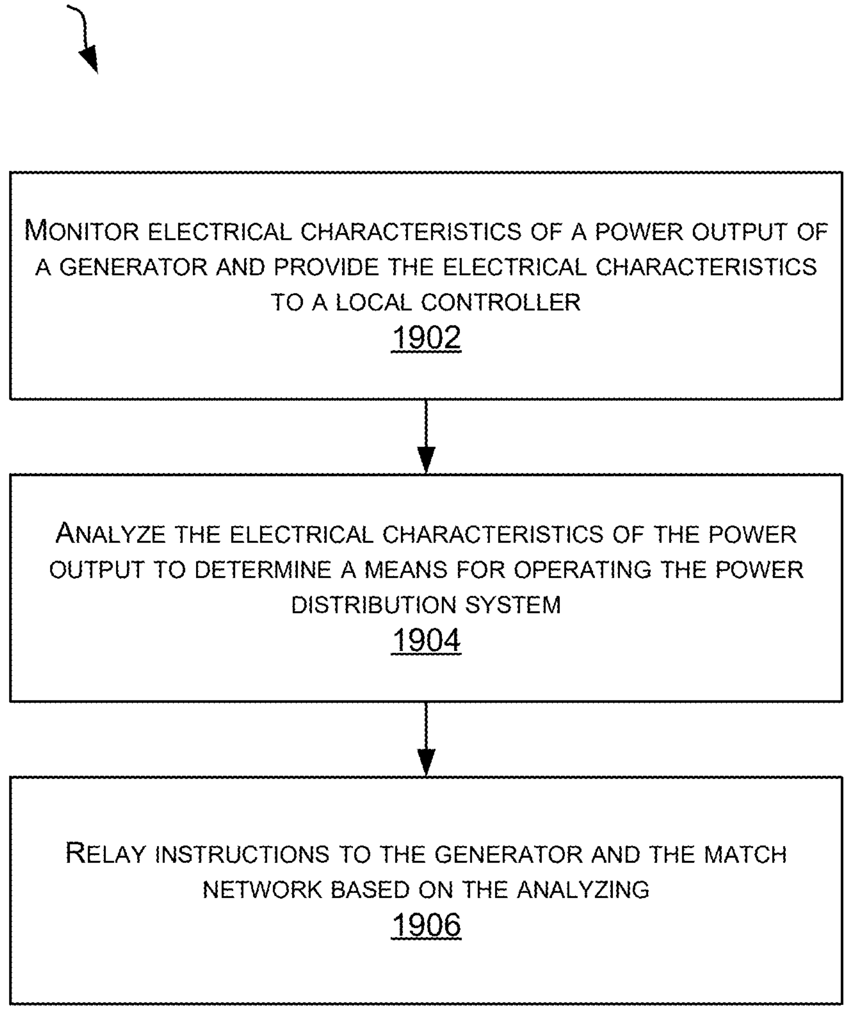
FIG. 19 illustrates a method of supplying power to a plasma load that may be traversed in connection with embodiments disclosed herein.

FIG. 19 illustrates a method 1900 of supplying power to a plasma load according to one embodiment of this disclosure. The method 1900 comprises a monitoring operation 1902, an analyzing operation 1904, and a relaying operation 1906. The monitoring operation 1902 involves monitoring electrical characteristics of a power output of a generator (e.g., 202) and providing the electrical characteristics of the power output to a local controller (e.g., 612). The analyzing operation 1904 can comprise analyzing electrical characteristics of the power output (e.g., voltage, current, phase, impedance, power). The analyzing operation 1904 can also involve determining how the power delivery system (e.g., 200) can be operated in order to meet power delivery requirements in light of the monitored electrical characteristics. The relaying operation 1906 can involve relaying (passing or transmitting) instructions to the generator and the match network of the power delivery system, where the instructions can be based on the analyzing operation 1904. The instructions can enable the simultaneous tuning of the generator and match network.

The previously described embodiments provide novel and nonobvious systems and methods to create laminate films, among other use cases. Examples such as diamond like carbon, which when deposited with plasma processing has very high stresses that can result in peeling of the film, can now be processed to incorporate low stress graphite or amorphous carbon layers so that the overall film still exhibits its diamond like carbon properties but at lower stresses. In some films, it may be desirable to deposit the film in one period followed by a period where the plasma chemistry is modified by pulsing control and a high bias is applied to densify the film. Aspects described herein enable production of nano-level "Bragg" structures consisting of alternative layers with different optical properties produced by combining pulsing and bias voltage control in each respective period as illustrated earlier. Said another way, a first chemistry can be achieved for a first period of time to deposit a first layer, then a second chemistry can be achieved for a second period of time to deposit a second layer. This can be repeated numerous times to achieve a "Bragg" structure. The different chemistries can be achieved by variations in one or more of: bias voltage; duty cycle of two or more bias voltages; alterations in the timing of bias voltage; source pulsing; duty cycle of source pulsing; source voltage; and source voltage and pulsing in combination.

Figure 20:
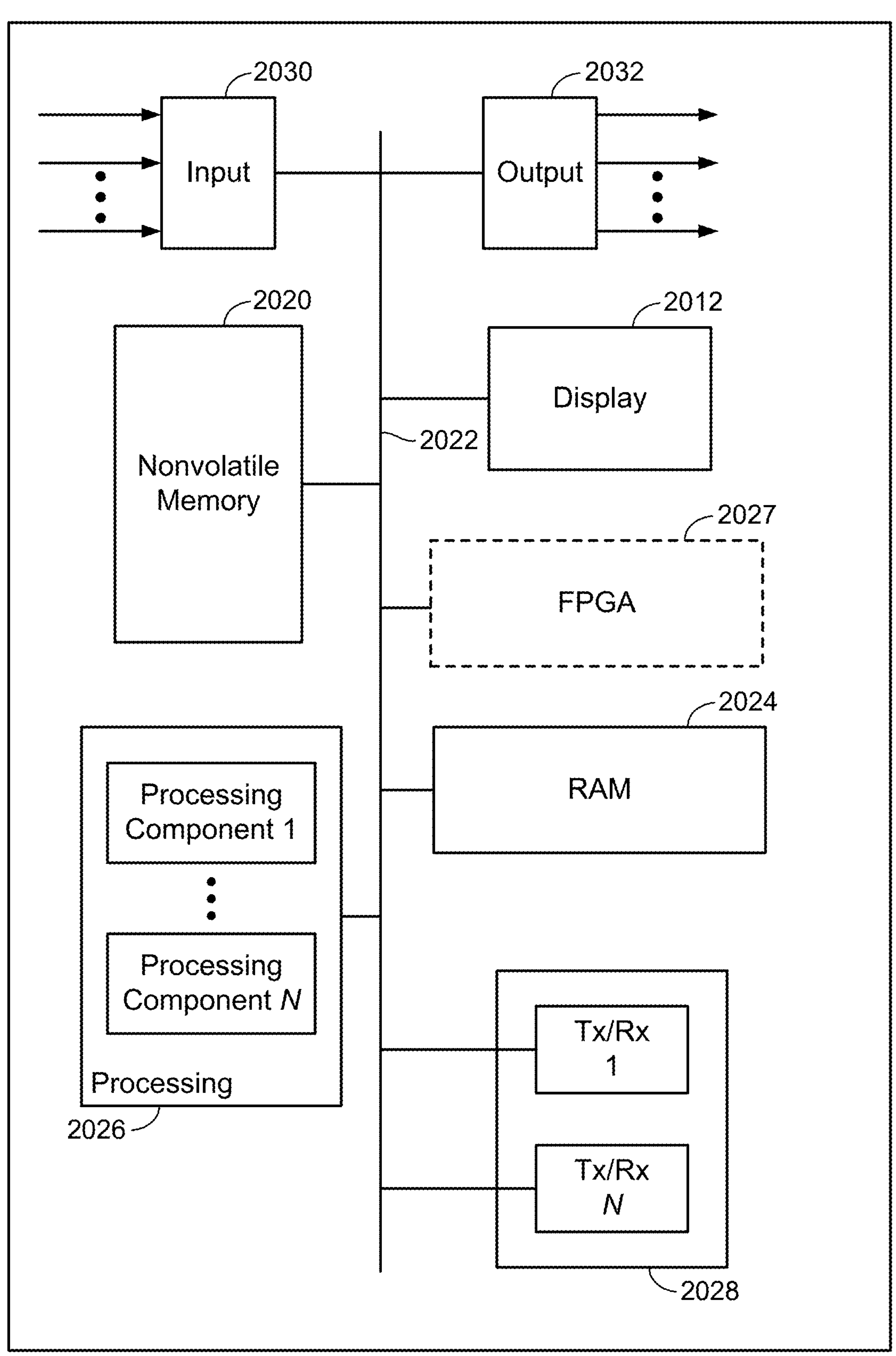
FIG. 20 is a block diagram depicting components that may be utilized to implement control aspects disclosed herein.

The methods described in connection with the embodiments disclosed herein may be embodied directly in hardware, in processor-executable code encoded in a non-transitory tangible processor readable storage medium, or in a combination of the two. Referring to FIG. 20 for example, shown is a block diagram depicting physical components that may be utilized to realize synchronization logic that may be implemented in equipment coupled to the plasma processing systems disclosed herein. As shown, in this embodiment a display portion 2012 and nonvolatile memory 2020 are coupled to a bus 2022 that is also coupled to random access memory ("RAM") 2024, a processing portion (which comprises N processing components) 2026, an optional field programmable gate array (FPGA) 2027, and a transceiver component 2028 that comprises N transceivers. Although the components depicted in FIG. 20 represent physical components, FIG. 20 is not intended to be a detailed hardware diagram; thus, many of the components depicted in FIG. 20 may be realized by common constructs or distributed among additional physical components. Moreover, it is contemplated that other existing and yet-to-be developed physical components and architectures may be utilized to implement the functional components described with reference to FIG. 20.

This display portion 2012 generally operates to provide a user interface for a user, and in several implementations, the display is realized by a touchscreen display. In general, the nonvolatile memory 2020 is non-transitory memory that functions to store (e.g., persistently store) data and processor-executable code (including executable code that is associated with effectuating the methods described herein). In some embodiments for example, the nonvolatile memory 2020 comprises bootloader code, operating system code, file system code, and non-transitory processor-executable code to facilitate the execution of the methods described herein (e.g., the methods described with reference to of FIGS. 15 and 17-19).

In many implementations, the nonvolatile memory 2020 is realized by flash memory (e.g., NAND or ONENAND memory), but it is contemplated that other memory types may also be utilized. Although it may be possible to execute the code from the nonvolatile memory 2020, the executable code in the nonvolatile memory is typically loaded into RAM 2024 and executed by one or more of the N processing components in the processing portion 2026.

The N processing components in connection with RAM 2024 generally operate to execute the instructions stored in nonvolatile memory 2020 to enable control and synchronization among equipment coupled to a plasma processing system. For example, non-transitory, processor-executable code to effectuate methods of synchronously pulsing and changing voltages of the source generators and bias supplies may be persistently stored in nonvolatile memory 2020 and executed by the N processing components in connection with RAM 2024. As one of ordinarily skill in the art will appreciate, the processing portion 2026 may comprise a video processor, digital signal processor (DSP), microcontroller, graphics processing unit (GPU), or other hardware processing components or combinations of hardware and software processing components (e.g., an FPGA or an FPGA including digital logic processing portions).

In addition, or in the alternative, the processing portion 2026 may be configured to effectuate one or more aspects of the methodologies described herein (e.g., methods of synchronously operating equipment of a plasma processing equipment). For example, non-transitory processor-readable instructions may be stored in the nonvolatile memory 2020 or in RAM 2024 and when executed on the processing portion 2026, cause the processing portion 2026 to perform methods of controlling modulating supplies and other equipment. Alternatively, non-transitory FPGA-configuration-instructions may be persistently stored in nonvolatile memory 2020 and accessed by the processing portion 2026 (e.g., during boot up) to configure the hardware-configurable portions of the processing portion 2026 to effectuate the functions disclosed herein (including the functions of the synchronization controller 1416.

The input component 2030 operates to receive signals (e.g., the synchronization signals or datasets with waveform characterization data) that are indicative of one or more aspects of the synchronized control between equipment of a plasma processing system. The signals received at the input component may comprise, for example, the power control and data signals, or control signals from a user interface.

Signals received at the input 2030 may also comprise signals indicative of current, voltage and/or phase received from a V-I sensor or direction coupler, for example. The output component generally operates to provide one or more analog or digital signals to effectuate an operational aspect of control and synchronization between the equipment. For example, the output portion 2032 may out the synchronization signal and/or waveform datasets.

The depicted transceiver component 2028 comprises N transceiver chains, which may be used for communicating with external devices via wireless or wireline networks. Each of the N transceiver chains may represent a transceiver associated with a particular communication scheme (e.g., WiFi, Ethernet, Profibus, etc.). The transceiver component may enable connections with the control bus 117, communication link 119, and/or signal paths 625, 626.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B or C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A method comprising:

receiving a first synchronization signal;

producing a first sequence of waveforms in response to the first synchronization signal;

receiving a second synchronization signal; and producing a second sequence of waveforms in response to the second synchronization signal, wherein the second sequence of waveforms is different than the first sequence of waveforms;

wherein each of the waveforms in the first sequence and the second sequence comprises a first portion that changes toward a positive voltage, a second portion comprising a peak voltage, a third portion comprising a negative voltage swing, and a fourth portion comprising a negative voltage ramp.

2. The method of claim 1, wherein the first sequence comprises a waveform with a first negative voltage swing and a waveform with a second negative voltage swing.

3. The method of claim 2, comprising:

receiving a waveform dataset defining the first negative voltage swing and the second negative voltage swing.

4. The method of claim 2, wherein the second sequence comprises a waveform with a third negative voltage swing and a waveform with fourth negative voltage swing.

5. The method of claim 3, comprising:

sending the first and second synchronization signals from a source generator;

wherein receiving the first and second synchronization signals comprises receiving the first and second synchronization signals at a bias supply, wherein the bias supply produces the first and second sequences of waveforms;

wherein receiving the waveform dataset defining the first negative voltage swing and a waveform with second negative voltage swing comprises receiving the waveform dataset at the bias supply.

6. The method of claim 5, wherein the sending the first and second synchronization signals from a source generator comprises sending the first and second synchronization signals responsive to a power output of the source generator changing.

7. The method of claim 2, comprising:

sending the first and second synchronization signals from a system controller;

wherein receiving the first and second synchronization signals comprises receiving the first and second synchronization signals at a bias supply, wherein the bias supply produces the first and second sequences of waveforms.

8. A non-transitory medium for storing instructions that are executable by a processor and/or provide configuration data for a field programmable gate array, the instructions comprising instructions for:

receiving a first synchronization signal;

producing a first sequence of waveforms in response to the first synchronization signal;

receiving a second synchronization signal; and producing a second sequence of waveforms in response to the second synchronization signal, wherein the second sequence of waveforms is different than the first sequence of waveforms;

wherein each of the waveforms in the first sequence and the second sequence comprises a first portion that changes toward a positive voltage, a second portion comprising a peak voltage, a third portion comprising a negative voltage swing, and a fourth portion comprising a negative voltage ramp.

9. The non-transitory medium for storing instructions of claim 8, wherein the first sequence comprises a waveform with a first negative voltage swing and a waveform with second negative voltage swing.

10. The non-transitory medium for storing instructions of claim 9, comprising:

receiving a waveform dataset defining the first negative voltage swing and the second negative voltage swing.

11. The non-transitory medium for storing instructions of claim 9, wherein the second sequence comprises a waveform with a third negative voltage swing and a waveform with fourth negative voltage swing.

12. The non-transitory medium for storing instructions of claim 10, wherein receiving the waveform dataset defining the first negative voltage swing and a waveform with second negative voltage swing comprises receiving the waveform dataset at a bias supply.

13. A bias supply comprising:

circuitry configured produce waveforms, wherein each waveform comprises a first portion that changes toward a peak voltage, a second portion comprising the peak voltage, a third portion comprising a negative voltage swing, and a fourth portion comprising a negative voltage ramp;

synchronization logic configured to:

receive a first synchronization signal and control the circuitry to produce a first sequence of waveforms in response to the first synchronization signal; and receive a second synchronization signal and control the circuitry to produce a first sequence of waveforms in response to the first synchronization signal.

14. The bias supply of claim 13 comprising:

wherein the first sequence comprises a waveform with a first negative voltage swing and a waveform with second negative voltage swing.

15. The bias supply of claim 14, wherein the synchronization logic is configured to receive a waveform dataset defining the first negative voltage swing and the second negative voltage swing.

16. The bias supply of claim 15, wherein the circuitry comprises:

a first node;

at least one switch that couples a second node to the first node via a first conductive path, and responsive to the at least one switch being closed, the peak voltage is produced at the first node before the negative voltage swing.

17. The bias supply of claim 16, wherein the circuitry comprises:

a power supply coupled between the first node and a third node to provide a voltage between the first node and the second node;

a first switch that couples the second node to the first node, and responsive to the first switch being closed, the peak voltage is applied at the first node; and a second switch that couples a third node to the first node, and responsive to the second switch being closed, the negative voltage swing is applied to the first node.

18. The bias supply of claim 17, wherein the first switch and the second switch are configured so both the first switch and the second switch are not closed at the same time.

* * * * *